(12) United States Patent
Godfried et al.

(10) Patent No.: US 10,146,134 B2
(45) Date of Patent: Dec. 4, 2018

(54) ILLUMINATION SYSTEM

(71) Applicant: ASML NETHERLANDS B.V., Veldhoven (NL)

(72) Inventors: Herman Philip Godfried, Amsterdam (NL); Hubertus Petrus Leonardus Henrica Van Bussel, Asten (NL); Wilhelmus Patrick Elisabeth Maria Op 'T Root, Nederweert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 143 days.

(21) Appl. No.: 15/511,570

(22) PCT Filed: Aug. 26, 2015

(86) PCT No.: PCT/EP2015/069508
§ 371 (c)(1),
(2) Date: Mar. 15, 2017

(87) PCT Pub. No.: WO2016/045897
PCT Pub. Date: Mar. 31, 2016

(65) Prior Publication Data
US 2017/0293229 A1    Oct. 12, 2017

(30) Foreign Application Priority Data

Sep. 25, 2014    (EP) .................................... 14186403

(51) Int. Cl.
| | | |
|---|---|---|
| *G03F 7/20* | (2006.01) | |
| *G02B 26/08* | (2006.01) | |
| *G02F 1/1335* | (2006.01) | |

(52) U.S. Cl.
CPC ...... *G03F 7/70116* (2013.01); *G02B 26/0833* (2013.01); *G02F 1/133526* (2013.01);
(Continued)

(58) Field of Classification Search
CPC .................. G01M 11/30; G01N 21/55; G02B 26/0833–26/085; G03F 7/70116;
(Continued)

(56) References Cited

U.S. PATENT DOCUMENTS

| 7,388,647 B2 | 6/2008 | Hult |
|---|---|---|
| 8,432,529 B2 | 4/2013 | Claessens et al. |

(Continued)

FOREIGN PATENT DOCUMENTS

| EP | 1 426 823 | 6/2004 |
|---|---|---|
| JP | S61-71631 | 4/1986 |
| JP | 2008-182115 | 8/2008 |
| WO | 2011/006581 | 1/2011 |
| WO | 2012/060099 | 5/2012 |
| WO | 2013/094733 | 6/2013 |
| WO | 2013/143666 | 10/2013 |
| WO | 2013/174680 | 11/2013 |

OTHER PUBLICATIONS

International Search Report and Written Opinion dated Nov. 9, 2015 in corresponding International Patent Application No. PCT/EP2015/069508.

(Continued)

*Primary Examiner* — Colin Kreutzer
(74) *Attorney, Agent, or Firm* — Pillsbury Winthrop Shaw Pittman LLP

(57) ABSTRACT

An illumination system for a lithographic apparatus includes an array of lenses configured to receive a radiation beam and focus the beam into a plurality of sub-beams, an array of reflective elements configured to receive the sub-beams and reflect the sub-beams so as to form an illumination beam, a beam splitting device configured to split the illumination beam into a first portion and a second portion wherein the first portion is directed to be incident on a lithographic patterning device, a focusing unit configured to focus the
(Continued)

second portion of the illumination beam onto a detection plane such that an image is formed at the detection plane and wherein the image is an image of the sub-beams in which the sub-beams do not overlap with each other and an array of detector elements configured to measure the intensity of radiation which is incident on the detection plane.

20 Claims, 6 Drawing Sheets

(52) U.S. Cl.
CPC ........ *G03F 7/7085* (2013.01); *G03F 7/70133* (2013.01); *G03F 7/70291* (2013.01)
(58) Field of Classification Search
CPC .. G03F 7/70133; G03F 7/702; G03F 7/70291; G03F 7/70483; G03F 7/70491; G03F 7/70508; G03F 7/70516; G03F 7/7055; G03F 7/7085

USPC .............. 355/67, 68, 77; 356/139.07, 139.1; 359/298, 855, 904; 700/121
See application file for complete search history.

(56) References Cited

U.S. PATENT DOCUMENTS

| | | |
|---|---|---|
| 2003/0081303 A1* | 5/2003 | Sandstrom ......... G02B 26/0841 359/291 |
| 2006/0146309 A1 | 7/2006 | Hult |
| 2009/0262324 A1 | 10/2009 | Patra et al. |
| 2011/0026001 A1 | 2/2011 | Claessens et al. |
| 2011/0069305 A1 | 3/2011 | Tanitsu et al. |

OTHER PUBLICATIONS

Japanese Office Action dated Dec. 8, 2017 in corresponding Japanese Patent Application No. 2017-513133.

* cited by examiner

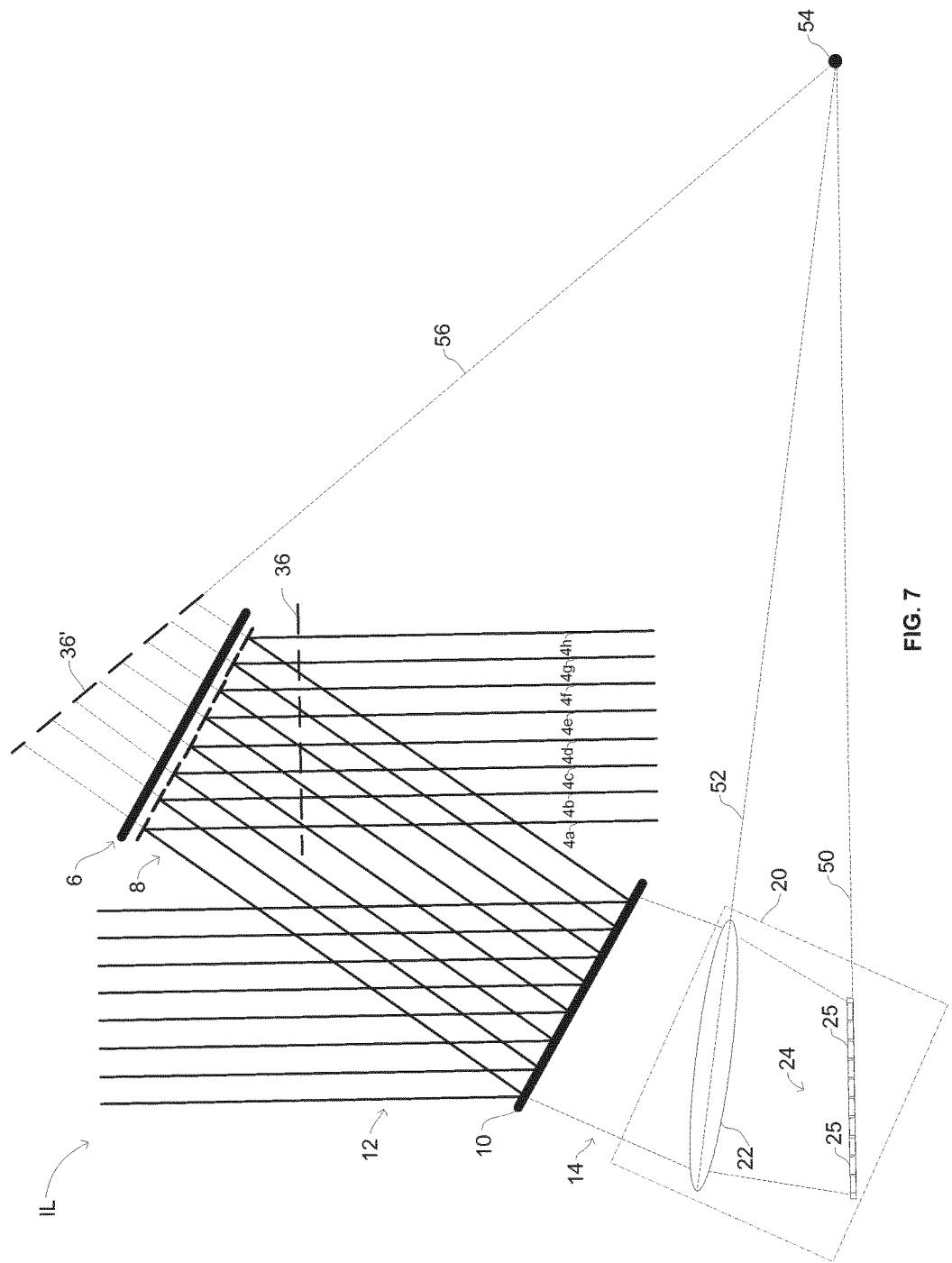

ILLUMINATION SYSTEM

CROSS-REFERENCE TO RELATED APPLICATIONS

This application is the U.S. national phase entry of PCT patent application no. PCT/EP2015/069508, which was filed on Aug. 26, 2015, which claims the benefit of priority of European patent EP application no. 14186403.3 which was filed on Sep. 25, 2014, and which is incorporated herein in its entirety by reference.

FIELD

The present invention relates to an illumination system for a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

A lithographic apparatus includes an illumination system for providing a beam of radiation with which to illuminate a patterning device. An illumination system may, for example, receive a radiation beam from a radiation source and may condition the radiation beam for illumination of a patterning device.

It is desirable to provide an illumination system which obviates or mitigates one or more of the problems of the prior art, whether identified herein or elsewhere.

SUMMARY

According to a first aspect there is provided An illumination system for a lithographic apparatus comprising an array of lenses configured to receive a beam of radiation and focus the beam of radiation into a plurality of sub-beams, an array of reflective elements configured to receive the sub-beams and reflect the sub-beams so as to form an illumination beam, a beam splitting device configured to split the illumination beam into a first portion and a second portion wherein the first portion is directed to be incident on a lithographic patterning device, a focusing unit configured to focus the second portion of the illumination beam onto a detection plane such that an image is formed at the detection plane and wherein the image is an image of the plurality of sub-beams in a plane which lies upstream of the array of reflective elements and wherein the sub-beams do not overlap with each other in the image and an array of detector elements configured to measure the intensity of radiation which is incident on the detection plane.

According to a second aspect there is provided an illumination system for a lithographic apparatus comprising an array of reflective elements configured to receive a beam of radiation and reflect a plurality of sub-beams of the radiation beam so as to form an illumination beam, a beam splitting device configured to split the illumination beam into a first portion and a second portion wherein the first portion is directed to be incident on a lithographic patterning device, a focusing unit configured to focus the second portion of the illumination beam onto a detection plane such that an image is formed at the detection plane and wherein the image is an image of the plurality of sub-beams in a plane which lies downstream of the array of reflective elements and wherein the sub-beams do not overlap with each other in the image and an array of detector elements configured to measure the intensity of radiation which is incident on the detection plane.

It is desirable during illumination of the lithographic patterning device to provide an illumination beam which has a desired spatial intensity distribution. The first and second aspects both allow the intensities of each of the sub-beams to be determined from measurements made by the array of detector elements. Since a plane in which the sub-beams do not overlap with each other is imaged onto the detection plane the intensities of each of the sub-beams may be determined independently. The determined intensities of the sub-beams may advantageously be used to determine a desired orientation of the reflective elements which results in an illumination beam having a desired spatial intensity distribution. For example, the orientation of the reflective elements may be controlled in response to the measurements made by the array of detector elements in order to provide an illumination beam having a desired spatial intensity distribution.

It may additionally or alternatively be desirable to determine the orientation of the reflective elements of the array of reflective elements. Since a plane which lies upstream of the array of reflective elements (the first aspect) or a plane which lies downstream of the array of reflective elements (the second aspect) is imaged onto the detection plane, the radiation which is incident on the detection plane depends on the orientation of the reflective elements of the array of reflective elements. Measurements which are made by the array of detector elements may therefore be used to determine the orientation of the reflective elements of the array of reflective elements.

The illumination system may further comprise an array of lenses configured to receive the beam of radiation, focus the beam of radiation into the plurality of sub-beams and direct the plurality of sub-beams onto the array of reflective elements.

The array of detector elements may be arranged such that a plurality of detector elements receives radiation which corresponds to each sub-beam.

The illumination system may further comprise a controller configured to determine a spatial intensity distribution of each sub-beam and use the spatial intensity distribution to determine the orientation of each of the reflective elements of the array of reflective elements.

The focusing unit may be configured to focus the second portion of the illumination beam onto the detection plane such that each detector element receives radiation which corresponds to a single one of the plurality of sub-beams.

The illumination system may further comprise a controller configured to determine the intensity of each of the plurality of sub-beams.

The illumination system may further comprise a plurality of actuators configured to adjust the orientation of the reflective elements of the array of reflective elements.

The controller may be operable, during an illumination time period, to control the actuators in response to the determined intensities of the plurality of sub-beams so as to form an illumination beam having a desired spatial intensity distribution.

The controller may be further operable to control the actuators, at times other than during the illumination time period, so as to orientate the reflective elements such that a range of planes, which when imaged onto the detection plane form an image of the sub-beams in which the sub-beams do not overlap, is extended when compared to the range of planes during the illumination time period.

The focussing unit may be operable to adjust the plane which is imaged onto the detection plane.

The illumination system may further comprise a filter element positioned upstream of the array of reflective elements, wherein the filter element is configured to transmit radiation such that it is incident on the array of reflective elements.

The filter element may be operable to block one or more regions of the filter element so as to prevent radiation from being incident on one or more reflective elements.

The array of detector elements may be positioned substantially at the detection plane.

The illumination system may further comprise a fluorescent plate positioned substantially at the detection plane and the array of detector elements may be configured to measure the intensity of radiation which is emitted from the fluorescent plate.

The illumination system may further comprise a second beam splitting device configured to split the second portion of the illumination beam into a first detection beam and a second detection beam, wherein the first detection beam is directed to the detection system and the second detection beam is directed to a second detection system comprising a second focussing unit and a second array of detector elements, wherein the second focusing unit is configured to focus the second detection beam onto a second detection plane such that a second image is formed at the second detection plane and wherein the second image is an image of the plurality of sub-beams in a second plane which is different to the plane which is imaged by the detection system which receives the first detection beam.

The focusing unit may be orientated substantially parallel with the detection plane.

The focussing unit may be orientated substantially parallel with the array of reflective elements.

The illumination system may further comprise a controller configured to determine, from measurements made by the array of detector elements, a fault with a reflective element of the array of reflective elements.

According to a third aspect there is provided a lithographic apparatus comprising an illumination system according to the first or second aspect, a support structure for supporting a patterning device, the patterning device serving to impart the first portion of the illumination beam with a pattern in its cross-section, thereby forming a patterned radiation beam, a substrate table for holding a substrate and a projection system for projecting the patterned radiation beam onto a target portion of the substrate.

According to a fourth aspect there is provided a method of imaging a radiation beam, the method comprising providing a beam of radiation, focussing the radiation beam with an array of lenses into a plurality of sub-beams, reflecting the plurality of sub-beams with an array of reflective elements so as to form an illumination beam, splitting the illumination beam into a first portion and a second portion, directing the first portion of the illumination beam to be incident on a lithographic patterning device, focussing the second portion of the illumination beam such that an image is formed at a detection plane, wherein the image is an image of the plurality of sub-beams in a plane which lies upstream of the array of reflective elements and wherein the sub-beams do not overlap with each other in the image and measuring the intensity of radiation which is incident on the detection plane with an array of detector elements.

According to a fifth aspect there is provided a method of imaging a radiation beam, the method comprising providing a beam of radiation, reflecting a plurality of sub-beams of the beam of radiation with an array of reflective elements so as to form an illumination beam, splitting the illumination beam into a first portion and a second portion, directing the first portion of the illumination beam to be incident on a lithographic patterning device, focussing the second portion of the illumination beam such that an image is formed at a detection plane, wherein the image is an image of the plurality of sub-beams in a plane which lies downstream of the array of reflective elements and wherein the sub-beams do not overlap with each other in the image and measuring the intensity of radiation which is incident on the detection plane with an array of detector elements.

The method may further comprise focussing the radiation beam with an array of lenses into the plurality of sub-beams and directing the plurality of sub-beams onto the array of reflective elements.

The array of detector elements may be arranged such that a plurality of detector elements receives radiation which corresponds to each sub-beam.

The method may further comprise determining a spatial intensity distribution of each sub-beam and using the spatial intensity distribution to determine the orientation of each of the reflective elements of the array of reflective elements.

The second portion of the illumination beam may be focussed onto the detection plane such that each detector element receives radiation which corresponds to a single one of the plurality of sub-beams.

The method may further comprise determining the intensity of each of the plurality of sub-beams.

The method may further comprise adjusting the orientation of the reflective elements of the array of reflective elements, during an illumination time period, in response to the determined intensities of the plurality of sub-beams so as to form an illumination beam having a desired spatial intensity distribution.

The method may further comprise adjusting the orientation of the reflective elements of the array of reflective elements, at times other than during the illumination time period, such that a range of planes, which when imaged onto the detection plane form an image of the sub-beams in which the sub-beams do not overlap, is extended when compared to the range of planes during the illumination time period.

The method may further comprise determining the intensity of each of the plurality of sub-beams at times other than during the illumination time period.

The method may further comprise determining the orientation of the reflective elements at times other than during the illumination time period.

The method may further comprise adjusting the plane which is imaged onto the detection plane.

The method may further comprise aligning a filter element positioned upstream of the array of reflective elements according to measurements made by the array of detector elements, wherein the filter element is configured to transmit radiation to be incident on the array of reflective elements.

The method may further comprise blocking one or more regions of the filter element so as to prevent radiation from being incident on one or more reflective elements.

The method may further comprise determining, from the measurements of the intensity of radiation which is incident on the detection plane, a fault with a reflective element of the array of reflective elements.

The method may further comprise splitting the second portion of the illumination beam into a first detection beam and a second detection beam, wherein the first detection beam is directed to the detection system, and focussing the second detection beam such that a second image is formed at a second detection plane and wherein the second image is an image of the plurality of sub-beams in a second plane which is different to the plane which is imaged by the detection system which receives the first detection beam.

According to a sixth aspect there is provided an illumination system for a lithographic apparatus comprising an array of lenses configured to receive a beam of radiation and focus the beam of radiation into a plurality of sub-beams, an array of reflective elements configured to receive the sub-beams and reflect the sub-beams so as to form an illumination beam, a beam splitting device configured to split the illumination beam into a first portion and a second portion wherein the first portion is directed to be incident on a lithographic patterning device, a focusing unit configured to focus the second portion of the illumination beam onto a detection plane such that an image is formed at the detection plane and wherein the image is an image of the plurality of sub-beams in which the sub-beams do not overlap with each other and an array of detector elements configured to measure the intensity of radiation which is incident on the detection plane.

According to a seventh aspect there is provided a method of imaging a radiation beam, the method comprising providing a beam of radiation, focussing the radiation beam with an array of lenses into a plurality of sub-beams, reflecting the plurality of sub-beams with an array of reflective elements so as to form an illumination beam, splitting the illumination beam into a first portion and a second portion, directing the first portion of the illumination beam to be incident on a lithographic patterning device, focussing the second portion of the illumination beam such that an image is formed at a detection plane, wherein the image is an image of the plurality of sub-beams in which the sub-beams of the plurality of sub-beams do not overlap with each other and measuring the intensity of radiation which is incident on the detection plane with an array of detector elements.

Features referred to above in connection with any aspects of the invention may be used in connection with any of the other aspects of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 is a schematic illustration of a portion of an illumination system IL according to an alternative embodiment of the invention.

DETAILED DESCRIPTION

Figure 1:
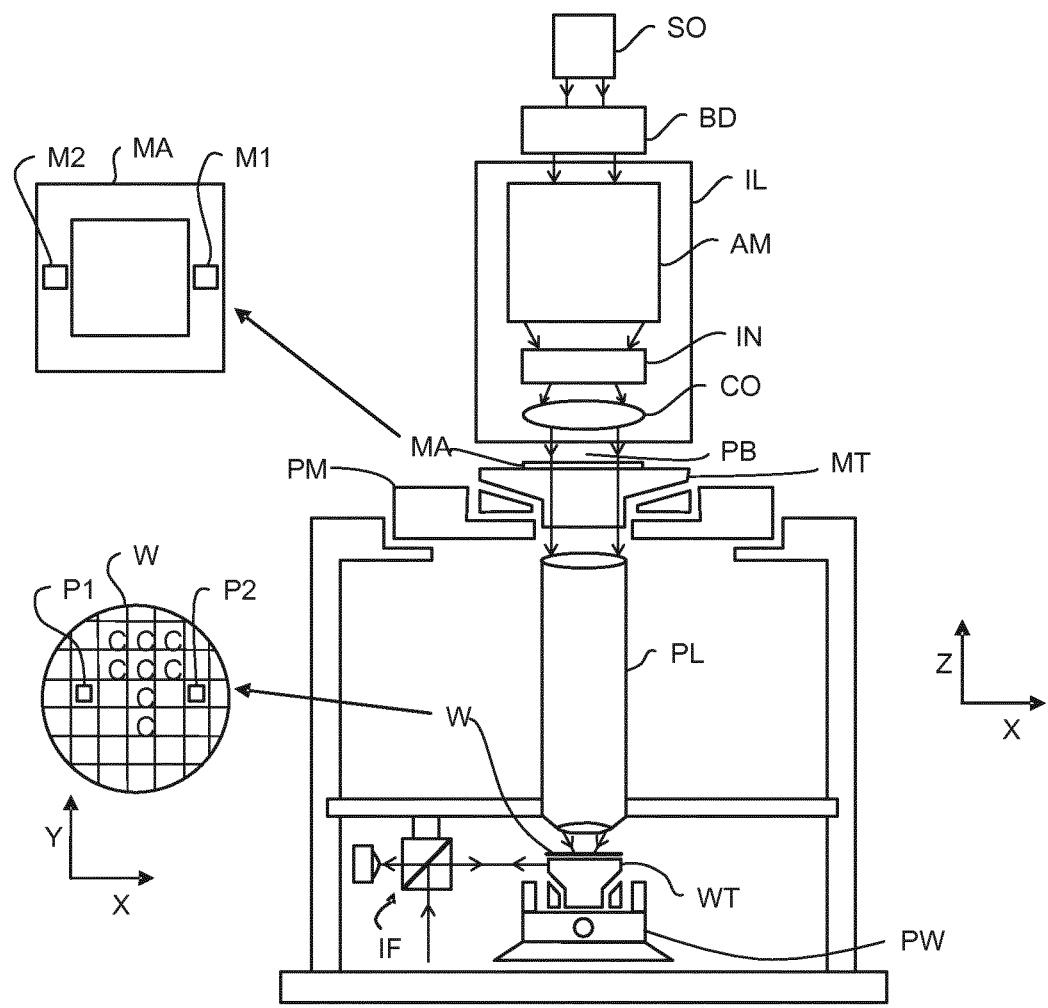
FIG. 1 is a schematic illustration of a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 4-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts an embodiment of a lithographic apparatus. The apparatus comprises:
- an illumination system (illuminator) IL to condition a beam PB of radiation (e.g. UV radiation or EUV radiation).
- a support structure (e.g. a support structure) MT to support a patterning device (e.g. a mask) MA and connected to first positioning device PM to accurately position the patterning device with respect to item PL;
- a substrate table (e.g. a wafer table) WT for holding a substrate (e.g. a resist coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above). A lithographic apparatus may include both transmissive and reflective optical elements.

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be integral part of the apparatus, for example when the source is a mercury lamp.

The illumination system IL may comprise adjusting means AM for adjusting the angular intensity distribution of the beam (e.g. to form different illumination modes). Generally, at least the outer and/or inner radial extent (commonly referred to as σ-outer and σ-inner, respectively) of the intensity distribution in a pupil plane of the illumination system can be adjusted. In addition, the illumination system IL generally comprises various other components, such as an integrator IN and a condenser CO. The illumination system provides a conditioned beam of radiation PB, having a desired uniformity and intensity distribution in its cross section.

The radiation beam PB is incident on the patterning device (e.g. mask) MA, which is held by the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
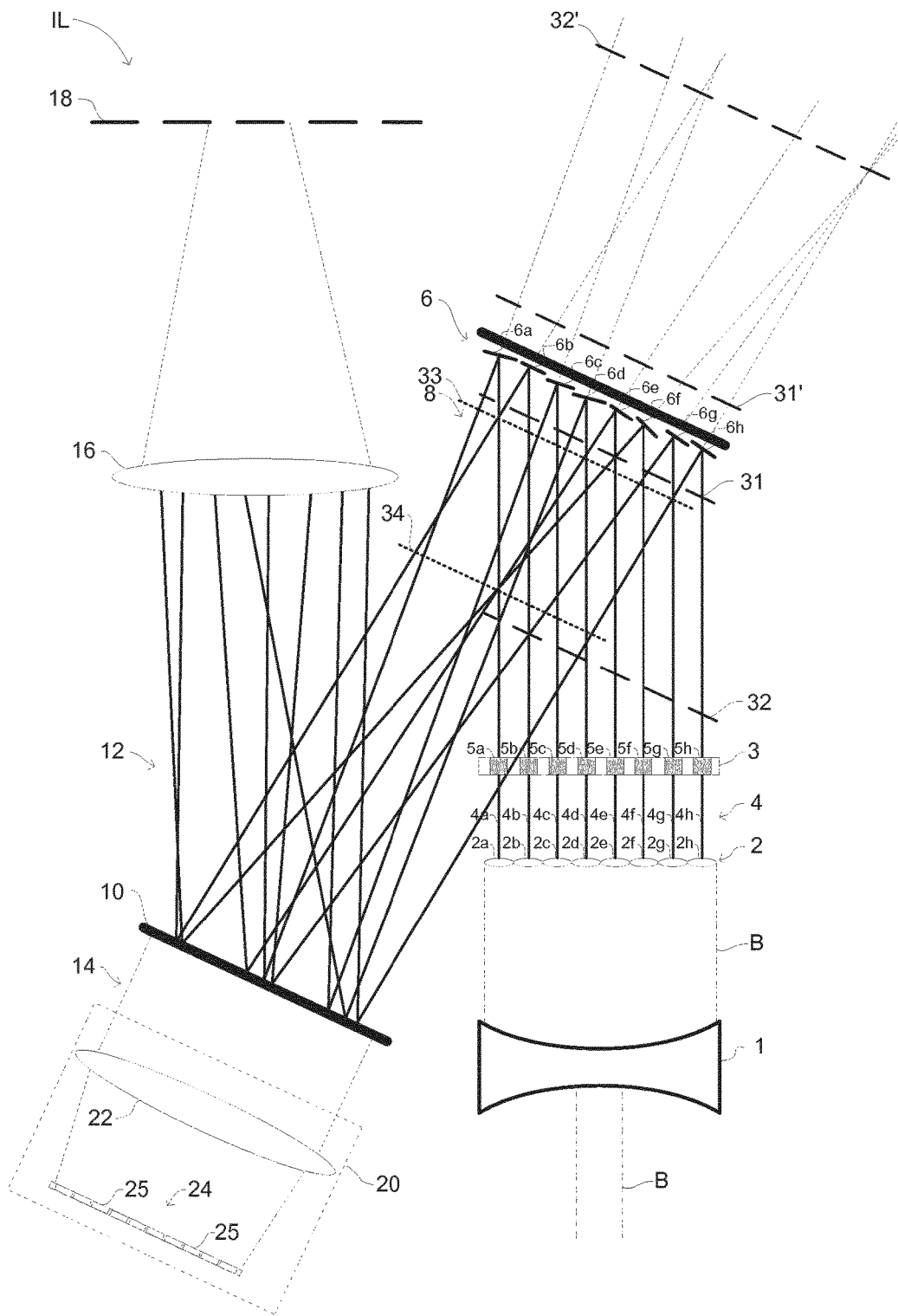
FIG. 2 is a schematic illustration of a portion of the illumination system IL according to an embodiment of the invention which forms part of the lithographic apparatus shown in FIG. 1.

FIG. 2 is a schematic depiction of a portion of an embodiment of the illumination system IL. The depicted portion may correspond with the adjusting mean AM shown in FIG. 1. The illumination system IL receives a radiation beam B (e.g. a UV radiation beam or an EUV radiation beam) from the radiation source SO (not shown in FIG. 2). The radiation beam B may, for example, be delivered to the illumination system IL by a beam delivery system as is shown in FIG. 1. Optionally the radiation beam B passes through beam divergence optics 1. Beam divergence optics 1 serve to expand the cross-section of the radiation beam B. The cross-section of the radiation beam B may, for example, be expanded so that it matches the size of one or more subsequent optical elements on which the radiation beam B is incident.

In the arrangement which is depicted in FIG. 2 the radiation beam B passes from the beam divergence optics 1 to an array of lenses 2. The array of lenses 2 which is shown in FIG. 2 comprises eight lenses 2a-2h. However in practice the array of lenses 2 may comprise many more lenses than are shown in FIG. 2. The array of lenses 2 may be arranged in a two-dimensional grid. For example the array of lenses 2 may comprise 1024 lenses arranged in a grid of 32×32 lenses or 4096 lenses arranged in a grid of 64×64 lenses. In general the array of lenses may comprise any suitable number of lenses. Each of the lenses 2a-2h which form the array of lenses 2 is configured to receive a portion of the radiation beam B and focus the portion into a respective sub-beam 4a-4h of radiation. The array of lenses 2 therefore focuses the radiation beam B into a plurality of sub-beams 4.

The plurality of sub-beams 4 of radiation is incident on a mirror array 6. The mirror array 6 comprises an array of reflective elements 6a-6h. Each of the lenses 2a-2h of the array of lenses 2 is configured to focus a sub-beam 4a-4h onto a single reflective element 6a-6h of the mirror array 6. Each reflective element 6a-6h therefore receives a single sub-beam 4a-4h.

Optionally a filter element 3 is positioned in between the array of lenses 2 and the mirror array 6. The filter element 3 may comprise an array of apertures 5a-5h which are arranged to allow the sub-beams 4a-4h to pass through the filter element 3. The filter element 3 may be operable to block one or more of the apertures 5a-5h in order to prevent one or more sub-beams 4a-4h from being incident on the mirror array 6. For example, in the event that a reflective element 6a-6h is faulty, the aperture 5a-5h which corresponds to the faulty reflective element 6a-6h may be blocked in order to prevent a sub-beam 4a-4h from being incident on the faulty reflective element 6a-6h.

Alternatively the filter element 3 may comprise a transparent material which is configured to transmit the sub-beams 4a-4h. One or more regions of the transparent material may be blocked in order to prevent one or more sub-beams 4a-4h from propagating through the filter element 3 (e.g. when a corresponding reflective element 6a-6h is faulty). The filter element 3 may, for example, comprise a glass plate. Regions of the glass plate may be blocked in order to prevent one or more sub-beams 4a-4h from being transmitted through the plate. For example, regions of the plate may be coated with chromium which serves to block radiation from propagating through the plate.

Additionally or alternatively a filter element 3 may be operable to attenuate one or more sub-beams 4a-4h so as to reduce the intensity of the one or more sub-beams 4a-4h on the mirror array.

The reflective elements 6a-6h are configured to reflect the sub-beams 4a-4h so as to form an illumination beam 8. The reflective elements 6a-6h of the mirror array 6 may be independently moveable such that the orientation of each reflective element 6a-6h may be controlled in order to control the direction in which each sub-beam 4a-4h is reflected. By controlling the direction in which each sub-beam 4a-4h is reflected an illumination beam 8 may be formed which has a desired cross-sectional intensity distribution at a location downstream of the mirror array 6.

The term illumination beam is used herein to refer to radiation which is reflected from the mirror array 6. It will be appreciated that in a region proximate the mirror array 6 the illumination beam 8 initially comprises sub-beams 4a-4h which are separated from each other. However the reflective elements 6a-6h may be orientated such that at locations downstream of the mirror array 6 the sub-beams 4a-4h overlap with each other so as to form a single radiation beam (e.g. in a field plane).

Providing reflective elements 6a-6h whose orientation may be independently controlled may result in there being gaps in between the reflective elements 6a-6h. The array of lenses 2 may be configured to focus the sub-beams 4a-4h such that the cross-section of each sub-beam 4a-4h approximately matches or is smaller than the cross-section of the reflective element 6a-6h on which the sub-beam is incident. This may ensure that little or no radiation is incident on the gaps in between the reflective elements 6a-6h thereby reducing any loss of radiation which may occur at the mirror array 6.

The illumination beam 8 is incident on a beam splitting device 10 which is configured to split the illumination beam into a first portion 12 and a second portion 14. In the embodiment which is depicted in FIG. 2 the beam splitting device 10 comprises a partially reflective mirror which reflects the first portion 12 and transmits the second portion 14 of the illumination beam 8. The partially reflective mirror may transmit approximately 1% of the illumination beam and may reflect approximately 99% of the illumination beam. In an alternative embodiment the first portion 12 may be transmitted by a partially reflective mirror which forms the beam splitting device 10 and the second portion 14 may be reflected by the partially reflective mirror. In general the beam splitting device 10 may comprise any optical element or combination of optical elements which split the illumination beam into a first and second portion.

The first portion 12 of the illumination beam 8 is subsequently directed to be incident on a patterning device MA (not shown in FIG. 2). The illumination system IL may include one or more optical elements which condition the first portion 12 of illumination beam 8 before it is incident on the patterning device MA. For example, as is shown in FIG. 2, the illumination beam 8 may be focussed by a focussing element 16. The focussing element 16 focusses the first portion 12 of the illumination beam 8 such that it has a desired cross-sectional area in a plane 18 of the illumination system IL. The plane 18 may be referred to as a pupil plane of the illumination system IL. The first portion 12 of the illumination beam 8 at the pupil plane 18 may act as a virtual radiation source for other parts of the illumination system IL which are not shown in FIG. 2. For example, the first portion 12 of the illumination beam 8 at the pupil plane 18 may act as a virtual radiation source for the integrator IN and/or the condenser CO which are shown in FIG. 1.

The reflective elements 6a-6h of the mirror array 6 may be orientated such that each sub-beam 4a-4h is directed to be incident at a desired location in the pupil plane 18. The location of the sub-beams 4a-4h in the pupil plane 18 may be controlled such that the first portion 12 of the illumination beam 8 at the pupil plane 18 has a desired spatial intensity distribution. The spatial intensity distribution of the illumination beam at the pupil plane 18 may be referred to as an illumination mode.

The spatial intensity distribution of the illumination beam at the pupil plane 18 may be converted to an angular intensity distribution before the radiation beam is incident upon the patterning device MA. In other words, there is a Fourier relationship between the pupil plane 18 of the illumination system IL and the patterning device MA (the patterning device is in a field plane). This is because the pupil plane 18 substantially coincides with the front focal plane of the condenser CO, which focuses the radiation beam onto the patterning device MA.

Control of the spatial intensity distribution at the pupil plane 18 can be used to improve the accuracy with which an image of the patterning device MA is projected onto a substrate W. In particular, spatial intensity distributions with dipole, annular or quadrupole illumination modes may be used to enhance the resolution with which the pattern is projected, or to improve other parameters such as sensitivity to projection lens aberrations, exposure latitude and depth of focus.

In order to bring about a desired spatial intensity distribution at the pupil plane 18 it is desirable to have a knowledge of the intensity of each of the sub-beams 4a-4h which are reflected by the reflective elements 6a-6h. If the intensity of each sub-beam 4a-4h is known then each reflective element 6a-6h may be orientated so as to direct the sub-beams 4a-4h to locations in the pupil plane 18 so as to bring about a desired spatial intensity distribution in the pupil plane 18. For example, if a relatively high intensity of radiation is desired at a given location in the pupil plane 18 then a reflective element from which a sub-beam 4a-4h having a relatively high intensity is reflected may be orientated so as to direct the sub-beam to the location in the pupil plane 18 at which the high intensity is desired. Additionally or alternatively a plurality of reflective elements 6a-6h may be orientated so as to direct their respective sub-beams 4a-4h to the same location in the pupil plane such that one or more sub-beams 4a-4h overlap at the pupil plane 18. In general, if the intensities of each of the sub-beams 4a-4h which are reflected from the reflective elements are known then the orientations of the reflective elements 6a-6h may be controlled to bring about any desired illumination mode in the pupil plane 18.

Figure 3A:
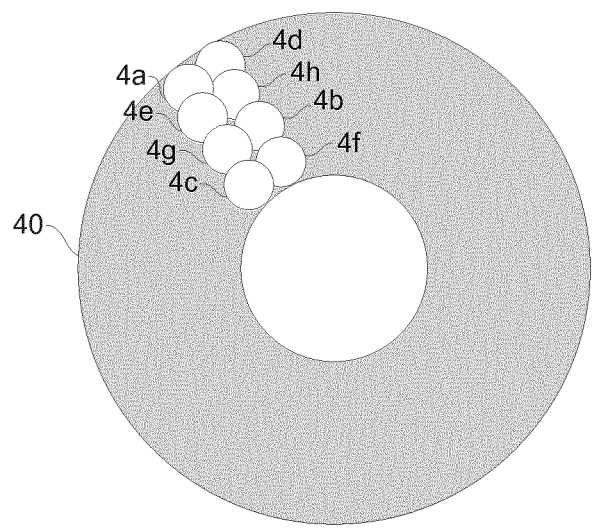
FIGS. 3A and 3B are schematic illustrations of illumination modes which may be formed by the illumination system of FIG. 2.
Figure 3B:
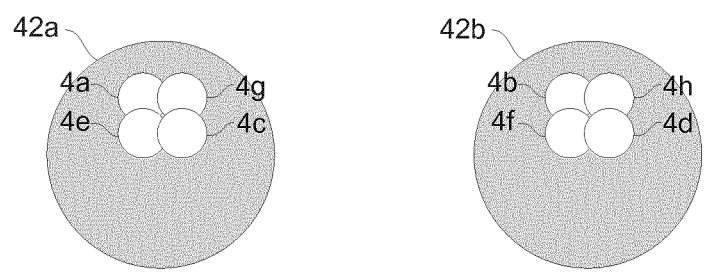

FIGS. 3A and 3B are schematic illustrations of two examples of illumination modes which may be formed at the pupil plane 18. The illumination mode which is shown in FIG. 3A may be referred to as an annular illumination mode. The annular illumination mode is formed by orientating the reflective elements 6a-6h of the mirror array such that the sub-beams 4a-4h are arranged within a ring of radiation 40 at the pupil plane 18. For ease of illustration only eight sub-beams 4a-4h are shown in FIG. 3A, however it will be appreciated that in practice many more sub-beams may form the ring of radiation 40 which forms the annular illumination mode which is depicted in FIG. 3A.

The illumination mode which is shown in FIG. 3B may be referred to as a dipole illumination mode. The dipole illumination mode is formed by orientating the reflective elements 6a-6h of the mirror array such that the sub-beams 4a-4h are arranged within two regions of radiation 42a, 42b at the pupil plane 18. For ease of illustration only eight sub-beams 4a-4h are shown in FIG. 3B, however it will be appreciated that in practice many more sub-beams may form the regions of radiation 42a, 42b which form the dipole illumination mode which is depicted in FIG. 3B.

The reflective elements 6a-6h of the mirror array 6 may be orientated so as to form other illumination modes than those shown in FIGS. 3A and 3B. For example the reflective elements 6a-6h may be orientated so as to form a quadrupole illumination mode comprising four regions of radiation.

Actuators may be configured to change the orientation of the reflective elements 6a-6h so as to bring about a desired orientation of the reflective elements 6a-6h. For example, the actuators may be operable to orientate the reflective elements 6a-6h so as to bring about a desired illumination mode at the pupil plane 18.

As was described above, the orientation of the reflective elements 6a-6h of the mirror array 6 provides a mapping between the intensities of the sub-beams 4a-4h which are reflected from the mirror array 6 and the spatial intensity distribution of the illumination beam 8 at the pupil plane 18. In general, if the intensities of the sub-beams 4a-4h which are reflected from the reflective elements 6a-6h are known then the reflective elements 6a-6h of the mirror array 6 may be orientated so as to form any desired illumination mode at the pupil plane 18. It will be appreciated that the intensities of each of the sub-beams 4a-4h which are reflected from the mirror array 6 depends on the spatial intensity distribution of the radiation beam B which is received from the radiation source SO, the focussing of sub-beams 4a-4b at the array of lenses 2 and the reflectivity of each of the reflective elements 6a-6h of the mirror array 6. The intensities of each of the sub-beams 4a-4h which are reflected from the mirror array 6 may also depend on any other optical elements through which the radiation passes before being reflected from the mirror array 6 (e.g. the beam divergence optics 1).

One or more of the factors which affect the intensities of the sub-beams 4a-4h may change over time. For example, the spatial intensity distribution of the radiation beam B may change over time. In particular the spatial intensity distribution of the radiation beam B may change with a change in mode of operation of the radiation source SO. In an embodiment the radiation source SO comprises a laser (e.g. an excimer laser). The spatial intensity distribution of the radiation beam B which is received from the radiation source SO may be relatively constant whilst the operating parameters of the laser (e.g. repetition frequency, duty cycle, pulse energy, bandwidth) remain constant. However if one or more of the operating parameters of the laser change then the spatial intensity distribution of the radiation beam B may change which will bring about a resulting change in the intensities of the sub-beams 4a-4h which are reflected from the mirror array 6.

Changes in the intensities of the sub-beams 4a-4h which are reflected from the mirror array 6 may additionally or alternatively result from changes in the reflectivity of one or more reflective elements 6a-6h of the mirror array 6. For example, the reflectivity of one or more of the reflective elements 6a-6h may degrade over time thereby reducing the intensity of the sub-beams 4a-4h which are reflected from the one or more reflective elements 6a-6h.

Changes in the intensities of the sub-beams 4a-4h which are reflected from the mirror array 6 may additionally or alternatively result from changes in any other optical elements with which the radiation beam B or the sub-beams 4a-4h interact (e.g. the beam delivery system BD, the beam divergence optics 1, the array of lenses 2 and/or the filter element 3).

The intensities of the sub-beams 4a-4b may be determined by measuring the second portion 14 of the illumination beam 8. In the arrangement which is shown in FIG. 2, the second portion 14 of the illumination beam 8 is transmitted at the beam splitting device 10 and is incident on a detection system 20 which is positioned behind the beam splitting device 10. The detection system 20 comprises a focussing unit 22 and an array of detector elements 24. The focussing unit 22 is configured to focus the second portion 14 of the illumination beam 8 onto the array of detector elements 24 so as to form an image of the plurality of sub-beams 4 at the array of detector elements 24. The focussing unit 22 may, for example, comprise one or more lenses. The array of detector elements 24 comprises individual detector elements 25 which are operable to measure the intensity of radiation which is incident upon them. The detector elements 25 may, for example, comprise charge-coupled devices (CCD) or CMOS sensors.

The image which is formed at the array of detector elements 24 is an image of the plurality of sub-beams 4 in a plane which lies upstream of the beam splitting device 10. The plane which is imaged at the array of detector elements 24 depends on the focal length of the focussing unit 22 and the positioning of the focussing unit and the array of detector elements 24.

In an embodiment the focussing unit 22 is configured to image a plane which lies upstream of the mirror array 6 onto the array of detector elements 24. Imaging a plane which lies upstream of the mirror array 6 (e.g. a plane which lies between the array of lenses 2 and the mirror array 6) is equivalent to forming a virtual image of the illumination beam 8 in a plane which lies behind the mirror array 6. For example, a first plane 31 is shown in FIG. 2 which may be imaged onto the array of detector elements 24 by the focussing unit 22. Imaging the first plane 31 is equivalent to tracing each of the sub-beams 4a-4h of the illumination beam 8 to a position behind the mirror array 6 to form a virtual image at a first virtual plane 31' which lies behind the mirror array 6 as is shown in FIG. 2. The first virtual plane 31' lies at an equivalent distance from the mirror array 6 as the first plane 31.

In the embodiment which is shown in FIG. 2, the array of detector elements 24 and the focussing unit 22 are orientated substantially parallel to each other. The parallel orientation of the focussing unit 22 and the array of detector elements 24 means that the plane which is imaged onto the array of detector elements 24 is also parallel with the focussing unit 22 and the array of detector elements 24. In the embodiment of FIG. 2 the mirror array 6 is also orientated such that it is substantially parallel with the focussing unit 22 and the array of detector elements 24. The first plane 31 which is imaged onto the array of detector elements is therefore orientated substantially parallel to the mirror array 6, the focussing unit 22 and the array of detector elements 24.

Figure 4A:
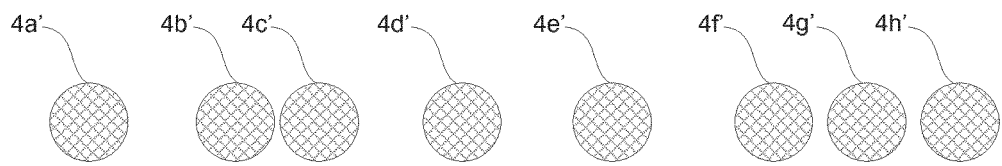
FIGS. 4A and 4B are schematic illustrations of images of sub-beams which may be formed in the illumination system IL of FIG. 2.

FIG. 4A is a schematic illustration of an image which is formed at the array of detector elements 24 when the focussing unit 22 is configured to image the first plane 31 which lies between the array of lenses 2 and the mirror array 6 onto the array of detector elements 24. The image which is depicted in FIG. 4A comprises a plurality of image sub-beams 4a'-4h'. Each of the image sub-beams 4a'-4h' corresponds with a respective sub-beam 4a-4h which is formed by the plurality of lenses 2.

It will be appreciated from FIG. 2, that the first virtual image 31' and therefore the corresponding image which is formed at the array of detector elements 24 depends on the orientation of the reflective elements 6a-6h. In the arrangement which is shown in FIG. 2 the reflective elements 6a-6h are not all orientated at the same angle and thus the sub-beams 4a-4h are reflected in different directions at the mirror array 6. The reflection of the sub-beams 4a-4h in different directions causes some of the sub-beams 4a-4h to travel towards each other after being reflected from the mirror array 6 and some of the sub-beam 4a-4h to travel away from each other after being reflected from the mirror array 6. As was explained above imaging the first plane 31 onto the array of detector elements 24 is equivalent to tracing the sub-beams 4a-4h back behind the mirror array 6 to the first virtual plane 31'. The orientation of the reflective elements affects the positions of the traced-back sub-beams 4a-4h at the first virtual plane 31' and therefore affects the relative position of the image sub-beams 4a'-4h' in the image which is formed at the array of detector elements 24.

It can be seen from FIG. 4A, that the image sub-beams 4a'-4h' are not uniformly spaced in the image which is formed at the array of detector elements 24. The image sub-beams 4a'-4h' are however in the same order as the sub-beams 4a-4h which are incident on the mirror array and are separated from each other such that they do not overlap. Each of the image sub-beams 4a'-4h' may therefore be easily identified as originating from a specific sub-beam 4a-4h which is incident on the mirror array 6. The intensity of each of the image sub-beams 4a'-4h' may therefore be independently measured by the array of detector elements 24 and may be used to determine the intensity of each of the sub-beams 4a-4h which are reflected from the mirror array 6.

The separation between the image sub-beams 4a'-4h' on the array of detector elements 24 depends on the distance from the mirror array 6 of the plane which is imaged onto the array of detector elements 24 and the orientation of the reflective elements 6a-6h of the mirror array. As was described above the first plane 31 which is imaged onto the array of detector elements 24 is sufficiently close to the mirror array 6 that the sub-beams 4a-4h are separated from each other and do not overlap. This allows the intensities of the image sub-beams 4a'-4h' to be independently measured at the array of detector elements 24 such that the intensities of the sub-beams 4a-4h which are reflected from the mirror array 6 may be independently determined.

Figure 4B:
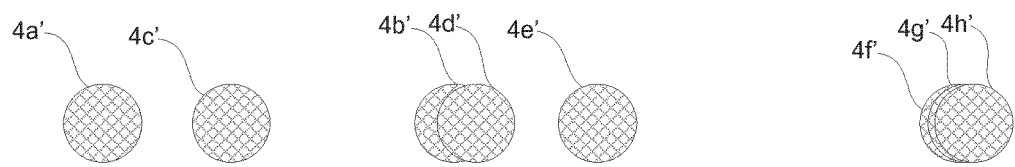

FIG. 4B is a schematic illustration of an image which is formed at the array of detector elements 24 when the focussing unit 22 is configured to image a second plane 32 onto the array of detector elements 24. The second plane 32 lies upstream of the mirror array 6 and at a greater distance from the mirror array 6 than the first plane 31. Imaging the second plane 32 onto the array of detector elements 24 is equivalent to tracing back each of the sub-beams 4a-4h of the illumination beam 8 to form a virtual image at a second virtual plane 32' which lies behind the mirror array 6 as is shown in FIG. 2. The second virtual plane 32' lies at an equivalent distance from the mirror array 6 as the second plane 32.

It can be seen from FIG. 2 and from the image depicted in FIG. 4B that the second plane 32 is sufficiently far from the mirror array 6 that some of the image sub-beams 4a-4h overlap with each other in the second virtual image plane 32' and therefore in the image which is formed at the array of detector elements 24 (and which is shown in FIG. 4B). For example, the image sub-beams 4b' and 4d' overlap with each other and the image sub-beams 4f', 4g' and 4h' overlap with each other. It can also be seen from the image shown in FIG. 4B that the order of some of the image sub-beams 4a'-4h' has changed. For example, the image sub-beams 4b' and 4c' appear in a different order in the image shown in FIG. 4B than the order in which the corresponding sub-beams 4a-4h are arranged when they are incident on the mirror array 6.

Overlapping of the image sub-beams 4a'-4h' at the array of detector elements 24 means that some regions of the array of detector elements 24 receive radiation from more than one image sub-beam. In a region which receives radiation from more than one image sub-beam it may not be possible to independently determine how much radiation originates from each of the image sub-beams which overlap. It is not therefore possible to independently determine the intensities of all of the sub-beams 4a'-4h'. It is therefore advantageous to image a plane onto the array of detector elements 24 at which the sub-beams 4a-4h of the plurality of sub-beams 4 do not overlap. This may allow the intensities of the image sub-beams 4a'-4h' which are formed on the array of detector elements to be independently measured at the array of detector elements 24 in order to independently determine the intensities of the sub-beams 4a-4h which are reflected from the mirror array 6.

The sub-beams 4a-4h are all separated from each other at the mirror array 6. Imaging a plane which is close to or substantially at the mirror array 6 onto the array of detector elements 24 therefore results in an image being formed in which the image sub-beams 4a'-4h' do not overlap with each other thereby allowing the intensities of the sub-beams 4a-4h which are reflected from the mirror array 6 to be independently determined. The likelihood of the image sub-beams 4a'-4h' overlapping with one another in the image which is formed at the array of detector elements increases with increasing distance of the plane which is imaged from the mirror array 6. It will be appreciated that the distance of the plane which is imaged from the mirror array 6 at which the image sub-beams 4a'-4h' do overlap depends on the particular orientation of the reflective elements 6a-6h.

In some embodiments the focussing unit 22 is configured to image a plane which lies downstream of the mirror array 6 onto the array of detector elements 24. For example, a third plane 33 which is shown in FIG. 2 and which lies downstream of the mirror array 6 may be imaged onto the array of detector elements 24. As was described above, when the reflective elements 6a-6h are orientated at different angles to each other the sub-beams 4a-4h do not all propagate in the same direction after being reflected from the mirror array 6. This means that in some planes which lie downstream of the mirror array 6, one or more of the sub-beams 4a-4h may overlap with each other. As was described above it is desirable to image a plane onto the array of detector elements 24 such that the image sub-beams 4a'-4h' do not overlap with each other in the image. In embodiments in which the focussing unit 22 is configured to image a plane which lies downstream of the mirror array 6 onto the array of detector elements 24, it is therefore desirable to image a plane at which the sub-beams 4a-4h do not overlap with each other. It will be appreciated that the distance downstream of the mirror array 6 at which the sub-beams 4a-4h overlap with each other depends on the orientation of the reflective elements 6a-6h. However, in general the likelihood of the sub-beams 4a-4h overlapping with one another in a plane downstream of the mirror array 6 increases with increasing distance of the plane from the mirror array 6.

In general a plane which lies any at distance from the mirror array 6 either upstream or downstream of the mirror array 6 may be imaged onto the array of detector elements 24. The orientation of the plane which is imaged onto the array of detector elements 24 depends on the orientation of the focussing unit 22 and the array of detector elements 24. For given orientations of the reflective elements 6a-6h there may be a limited range of planes which may be imaged on to the array of detector elements 24 so as to form an image in which the image sub-beams 4a'-4h' do not overlap. For example, imaging planes which lie between the first plane 31 and the third plane 33 on to the array of detector elements 24 may result in an image being formed in which the image sub-beams 4a'-4h' do not overlap. However imaging planes which lie further upstream than the first plane 31 or further downstream than the third plane 33 on to the array of detector elements 24 may result in an image being formed in which the image sub-beams 4a'-4h' overlap with each other.

For ease of description a range of planes which may be imaged onto the array of detector elements 24 so as to form an image in which the image sub-beams 4a'-4h' do not overlap with each other is herein referred to as a range of non-overlapping planes.

The range of non-overlapping planes depends on the orientation of the reflective elements 6a-6h. Whilst an orientation of the reflective elements has been described above in which a range of non-overlapping planes extends between the first plane 31 and the third plane 33 for other arrangements of the reflective elements 6a-6h the range of non-overlapping planes may be different. For example, for another arrangement of the reflective elements 6a-6h the range of non-overlapping planes may extend between the second plane 32 and a fourth plane 34 (shown in FIG. 2).

In general the range of non-overlapping planes may be centred on the mirror array 6. That is, the distance from the mirror array 6 to the furthest plane downstream of the mirror array 6 which may be imaged such that the image sub-beams 4a'-4h' do not overlap may be substantially the same as the distance from the mirror array 6 to the furthest plane upstream of the mirror array 6 which may be imaged such that the image sub-beams 4a'-4h' do not overlap.

A plane which lies upstream or downstream of the mirror array 6 may be imaged onto the array of detector elements 24 during normal operation of the illumination system IL and the lithographic apparatus LA. This may allow the intensities of the image sub-beams 4a'-4h' to be measured and the intensities of the sub-beams 4a-4h to be determined during normal operation of the illumination system IL and the lithographic apparatus LA. This advantageously reduces any down time of the lithographic apparatus LA which may otherwise be required to determine the intensities of the sub-beams 4a-4h.

During normal use of the illumination system IL and the lithographic apparatus LA the orientation of the reflective elements 6a-6h depends on the desired illumination mode at the pupil plane 18. A time period during which the reflective elements 6a-6h are orientated so as to form a desired illumination mode may be referred to as an illumination time period. For some illumination modes the orientation of the reflective elements 6a-6h may be such that the range of non-overlapping planes may be relatively limited. That is, only planes which are relatively close to the mirror array 6 (either upstream or downstream of the mirror array 6) may be imaged onto the array of detector elements 24 so as to form an image in which the image sub-beams 4a'-4h' do not overlap.

Figure 5:
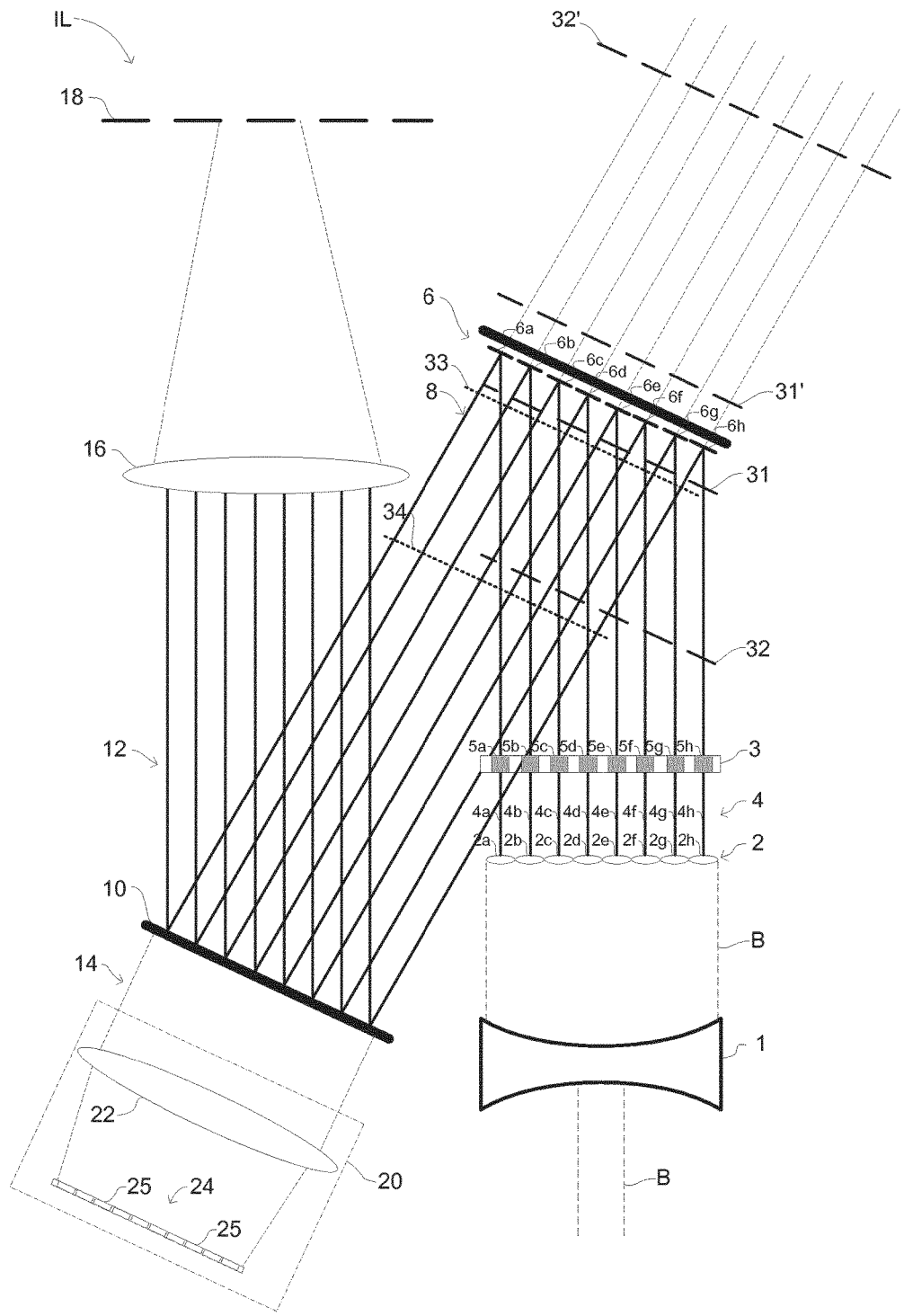
FIG. 5 is a schematic illustration of a portion of the illumination system IL of FIG. 2 in an alternative mode of operation.

The range of non-overlapping planes may be extended by orientating the reflective elements 6a-6h such that each of the sub-beams 4a-4h is reflected so as to propagate in substantially the same direction. FIG. 5 is a schematic depiction of the portion of the illumination system IL shown in FIG. 2 but with the reflective elements 6a-6h orientated at substantially the same angle as each other. The sub-beams which are reflected from the mirror array 6 therefore propagate substantially parallel to each other and do not overlap with each other. The range of non-overlapping planes is therefore extended such that a plane which lies at any distance upstream or downstream of the mirror array 6 and which lies upstream of the beam splitting device 10 may be imaged on to the array of detector elements 24 so as to form an image in which the image sub-beams 4a'-4h' do not overlap with each other.

The reflective elements 6a-6h may be orientated as shown in FIG. 5 such that the range of non-overlapping planes is extended at times at which a conventional illumination mode is required at the pupil plane 18 (the conventional illumination mode may be a disk shape). For example, a lithographic apparatus LA may expose a series of substrates in succession. After exposure of a substrate W the substrate may be unloaded from the substrate table WT and a new substrate W loaded onto the substrate table W for exposure. During the process of loading and unloading a substrate W from the substrate table WT the illumination mode used for substrate exposure may not be required at the pupil plane 18 since no substrate is being exposed. The reflective elements 6a-6h may therefore be orientated as shown in FIG. 5 (e.g. to form a conventional illumination mode) such that the range of non-overlapping planes is extended. During such a time any plane in the extended range of non-overlapping planes may be imaged on to the array of detectors 24 and the intensities of the sub-beams 4a-4h may be determined. The determined intensities of the sub-beams 4a-4h may, for example, be used to determine a desired orientation of the reflective elements 6a-6h which brings about a desired illumination mode at the pupil plane 18. The reflective elements may then be re-arranged (e.g. using actuators) so as to bring about the desired orientation of the reflective elements 6a-6h in preparation for exposing a subsequent substrate W.

In between exposures of one or more substrates W one or more calibration or control processes may be performed. For example, one or more components of the lithographic apparatus may be checked and/or calibrated between substrate exposures. A calibration process may require one or more sensors to be exposed to radiation from the radiation source SO. During a calibration process in which one or more sensors are exposed, the illumination mode which is formed at the pupil plane 16 may not be important to the calibration process which is being performed. The reflective elements 6a-6h may therefore be orientated so as to extend the range of non-overlapping planes during such a calibration process (e.g. by orientating the reflective elements 6a-6h so as to form a conventional illumination mode as shown in FIG. 5). A calibration process during which the range of non-overlapping planes may be extended may therefore provide an opportunity during which a plane which lies at a relatively large distance from the mirror array 6 (either upstream or downstream of the mirror array 6) may be imaged onto the array of detector elements 24 such that the image sub-beams 4a'-4h' which are formed on the array of detector elements 24 do not overlap with each other.

A calibration process which may be performed in between substrate exposures may include exposing an interferometer to a radiation beam from the radiation source SO. The interferometer may be configured to detect aberrations in the radiation beam which may, for example, be caused by distortions of optical elements in the optical path between the radiation source SO and the interferometer. During exposure of an interferometer the reflective elements 6a-6h may be orientated so as to form an illumination mode which is suitable for detecting aberrations in the radiation beam at the interferometer. The orientation of the reflective elements 6a-6h which forms an illumination mode which is suitable for detecting aberrations may be different from the orientation of the reflective elements 6a-6h which is shown in FIG. 5 in which the reflective elements 6a-6h are orientated at substantially the same angle as each other such that the sub-beams 4a-4h propagate substantially parallel to each other. However the orientation of the reflective elements 6a-6h during exposure of an aberration sensor may be such that the range of non-overlapping planes is extended (e.g. compared with the range of non-overlapping planes during a substrate exposure). Times during which an aberration sensor is being exposed may therefore provide an opportunity during which a plane which lies at a relatively large distance from the mirror array 6 (either upstream or downstream of the mirror array 6) may be imaged onto the array of detector elements 24 such that the image sub-beams 4a'-4h' which are formed on the array of detector elements 24 do not overlap with each other.

As was described above the reflective elements 6a-6h may at times be orientated so as to extend the range of non-overlapping planes. This may be advantageous for a number of reasons, a discussion of which is given below.

The cross-sections of the sub-beams 4a-4h may vary in different planes upstream and downstream of the mirror array 6. For example, in one embodiment the focussing of the sub-beams 4a-4h by the array of lenses 2 may cause the cross-sections of the sub-beams 4a-4h to decrease away from the array of lenses and towards the mirror array 6. The cross-sections of the sub-beams may then increase after having been reflected by the mirror array and may increase with increasing distance downstream of the mirror array 6. In other embodiments the sub-beams 4a-4h may be focussed differently and the cross-sections of the sub-beams 4a-4h may not be at a minimum at the mirror array 6. In general the array of lenses 2 causes the cross-sections of the sub-beams 4a-4h to vary in different planes upstream and downstream of the mirror array 6.

The size of each of the image sub-beams 4a'-4h' which are incident on the array of detector elements 24 therefore at least partly depends on the plane which is imaged onto the array of detector elements 24 by the focussing unit 22. For example, the size of the image sub-beams 4a'-4h' on the array of detector elements 24 may be different if the first plane 31 is imaged onto the array of detector elements 24 than if the second plane 32 is imaged onto the array of detector elements. The first plane 31 is proximate the mirror array 6 whereas the second plane 32 is further from the mirror array 6 and closer to the array of lenses 2. The plane which is imaged onto the array of detector elements 24 may therefore be chosen in order to bring about image sub-beams 4a'-4h' which have desired sizes on the array of detector elements 24.

The size of the image sub-beams on the array of detector elements 24 may also depend on the imaging properties of the focussing unit 22 and the distance between the focusing unit 22 and the array of detector elements 24. The focussing properties of the focussing unit and/or the positioning of the focussing unit and the array of detector elements 24 may therefore be controlled in order to control the size of the image sub-beams 4a'-4h' on the array of detector elements 24. For example, actuators may be configured to move the focussing unit and/or the array of detector elements 2. The actuators may be controlled in order to control the size of the image sub-beams 4a'-4h' on the array of detector elements 24. However, the varying size of the sub-beams 4a-4h in different planes upstream and downstream of the mirror array 6 provides an extra degree of freedom which may be used to control the size of the image sub-beams 4a'-4h' at the array of detector elements 24.

When an extended range of non-overlapping planes is available, a larger range of planes are available which may be imaged onto the array of detector elements. The planes which are imaged onto the array of detector elements may be chosen in order to ensure that the sizes of the image sub-beams 4a'-4h' which are incident on the array of detector elements 24 are such that the array of detector elements 24 can independently measure the intensity of each image sub-beam 4a'-4h'. In particular the focussing unit 22 may be configured to focus the second portion 14 of the illumination beam 8 onto the array of detector elements 24 such that each detector element only receives radiation which corresponds to a single one of the plurality of sub-beams 4. This will be further explained below with reference to FIGS. 6A and 6B. In the example which is described below with reference to FIGS. 6A and 6B the sub-beams 4a-4h are focussed by the array of lenses 2 such that the cross-sections of the sub-beams 4a-4h are at a minimum on the mirror array 6. That is, the cross-sections of the sub-beams 4a-4h decrease towards the mirror array 6 and increase away from the mirror array 6 having been reflected by the mirror array 6. However as was described above in other embodiments the sub-beams 4a-4h may be focussed differently and the cross-sections of the sub-beams 4a-4h may not be at a minimum at the mirror array 6.

Figure 6A:
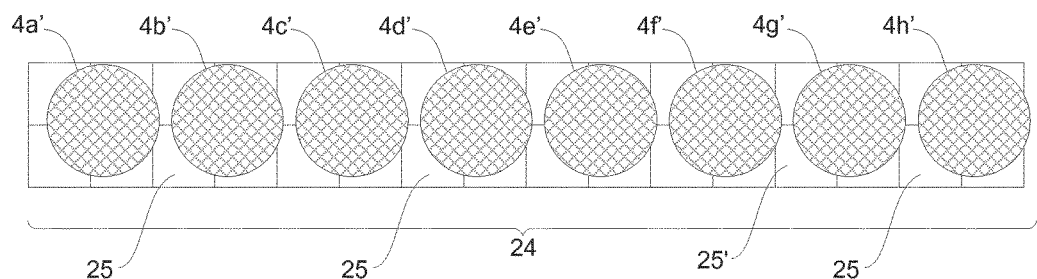
FIGS. 6A and 6B are schematic illustrations of images of sub-beams which may be formed in the illumination system IL using the mode of operation shown in FIG. 5.

FIG. 6A is a schematic illustration of an embodiment of the array of detector elements 24. The array of detector elements 24 comprises individual detector elements 25 arranged in a grid like pattern. Also shown in FIG. 6A are image sub-beams 4a'-4h' incident on the array of detector elements 24. In the example which is shown in FIG. 6A the focussing unit 22 is configured to image the second plane 32 which is relatively far from the mirror array 6 onto the array of detector elements 24. Since the second plane 32 is relatively far from the mirror array 6 (and the cross-sections of the sub-beams 4a-4h decrease towards the mirror array 6) the image sub-beams 4a'-4h' have relatively large cross-sections on the array of detector elements 24. This causes some of the detector elements 25 to receive radiation from more than one image sub-beam 4a'-4h'. For example, the detector element which is labelled 25' in FIG. 6A receives some radiation from the image sub-beam 4f' and some radiation from the image sub-beam 4g'. In this situation it may not be possible to independently determine the intensity of the image sub-beam 4f' and the intensity of the image sub-beam 4g' since any change in the intensity which is measured by the detector element 25' may be due to a change in the intensity of the image sub-beam 4f' or may be due to a change in the intensity of the image sub-beam 4g'.

Figure 6B:
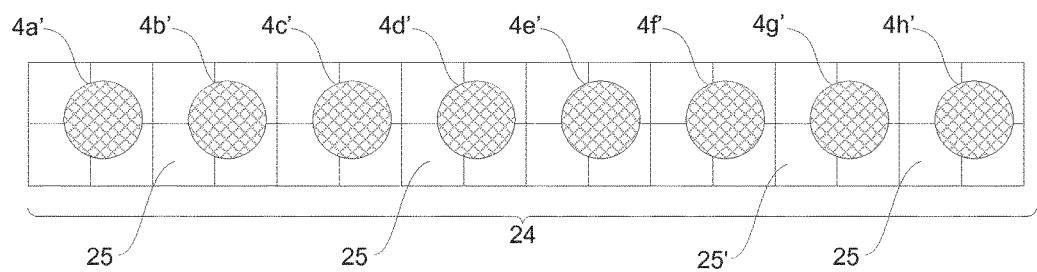

FIG. 6B is a schematic illustration of the same embodiment of the array of detector elements 24 as shown in FIG. 6A but in the example shown in FIG. 6B the focussing unit 22 is configured to image the first plane 31 onto the array of detector elements 24. As can be seen in FIG. 2, the first plane 31 is closer to the mirror array 6 and further away from the array of lenses 2 than the second plane 32. The size of the image sub-beams 4a'-4h' in FIG. 6B when the first plane 31 is imaged onto the array of detector elements 24 is therefore smaller than the size of the image sub-beams 4a'-4h' in FIG. 6A when the second plane 32 is imaged onto the array of detector elements 24. The smaller size of the image sub-beams 4a'-4h' on the array of detector elements 24 in FIG. 6B results in each detector element 25 only receiving radiation from a single image sub-beam 4a'-4h'. In particular the detector element 25' which receives radiation from two image sub-beams 4f' and 4g' in FIG. 6A only receives radiation from a single image sub-beam 4g' in FIG. 6B. This may allow the intensity of each image sub-beam 4a'-4h' to be independently determined since the intensity which is measured by each detector element 25 only corresponds to a single image sub-beam.

In other embodiments the size of the image sub-beams 4a'-4h' when the first and second planes 31, 32 are imaged onto the array of detector elements 24 may be different than is shown in FIGS. 6A and 6B. However the plane which is imaged onto the array of detector elements may still be chosen such that each detector element 25 only receives radiation from a single image sub-beam 4a'-4h' thereby allowing the intensity of each image sub-beam 4a'-4h' to be independently determined.

As was described above when the illumination system IL and lithographic apparatus LA are operating so as to expose a substrate W, the reflective elements 6a-6h may be orientated such that the range of non-overlapping planes is limited to a small range around the mirror array 6. Planes close to the mirror array 6 may therefore be imaged on to the array of detector elements 24 such that relatively small image sub-beams 4a'-4h' are formed on the array of detector elements 24. However, as is shown in FIG. 4A, when the reflective elements 6a-6h are orientated at different angles then the spacing of the image sub-beams 4a'-4h' in the image may not be uniform. This may cause more than one image sub-beam 4a'-4h' to be incident on a single detector element 25 since the separation between image sub-beams 4a'-4h' may be reduced.

When the reflective elements 6a-6h are arranged so as to extend the range of non-overlapping planes (e.g. between exposures) the sub-beams 4a-4h and the image sub-beams 4a'-4h' may be uniformly spaced from one another. It is therefore easier to form an image on the array of detector elements 24 such that each detector element 25 only receives radiation from a single image sub-beam 4a-4h. In general providing an extended range of non-overlapping planes provides greater flexibility to select a plane to image onto the array of detector elements 24 such that the image sub-beams 4a'-4h' have desired sizes and positions on the array of detector elements 24 relative to the size and position of the detector elements 25.

As has been described above the position of the image sub-beams 4a'-4h' on the array of detector elements 24 depends on the orientation of the reflective elements 6a-6h.

This dependence of the position of the image sub-beams $4a'$-$4h'$ on the orientation of the reflective elements $6a$-$6h$ may allow the orientation of the reflective elements $6a$-$6h$ to be determined by measuring the image sub-beams $4a'$-$4h'$ at the array of detector elements 24.

The orientations of the reflective elements $6a$-$6h$ of the mirror array 6 may be determined, for example, by measuring the position of each of the image sub-beams $4a'$-$4h'$ on the array of detector elements. Additionally or alternatively the orientations of the reflective elements $6a$-$6h$ may be determined by measuring the spatial intensity distributions of each image sub-beam $4a'$-$4h'$. This may be possible if the resolution of detector elements 25 in the array of detector elements 24 is sufficiently large such that each image sub-beam $4a'$-$4h'$ is incident on a plurality of detector elements 25. For example, an image sub-beam $4a'$-$4h'$ may be spread over four detector elements 25 of the array of detector elements 24. The detector elements 25 may be arranged in a grid like formation such that an image sub-beam $4a'$-$4h'$ is spread over a 2×2 grid of detector elements 25. Alternatively an image sub-beam $4a'$-$4h'$ may be spread over more than four detector elements 24. For example, an image sub-beam $4a'$-$4h'$ may be spread over twenty-five detector elements (e.g. arranged in a grid of 5×5 detector elements).

In embodiments in which an image sub-beam $4a'$-$4h'$ is spread over a plurality of detector elements 25 a measurement of the intensity of radiation which is incident on each detector element 25 over which the image sub-beam $4a'$-$4h'$ is spread may allow the spatial intensity distribution of the image sub-beam $4a'$-$4h'$ to be determined. The spatial intensity distribution of each image sub-beam $4a'$-$4h'$ may be a function of the angle of incidence and the angle of reflection of the respective sub-beam $4a$-$4h$ on the reflective element $6a$-$6h$ of the mirror array 6 from which the sub-beam $4a$-$4h$ is reflected. The spatial intensity distribution of each image sub-beam $4a'$-$4h'$ on the array of detector elements 24 may therefore be a function of the orientation of the reflective element $6a$-$6h$ from which the corresponding sub-beam $4a$-$4h$ is reflected. In particular the centre of mass of an intensity distribution of an image sub-beam $4a'$-$4h'$ may be a function of the orientation of the reflective elements $6a$-$6h$ from which the corresponding sub-beam $4a$-$4h$ is reflected. The centre of mass of the intensity distribution refers to a weighted centre of the intensity distribution which is analogous to the centre of gravity of a body which has a distribution of mass. A measurement of the spatial intensity distribution of each image sub-beam $4a'$-$4h'$ and/or a determination of a centre of mass of the intensity distribution of the image sub-beams $4a'$-$4h'$ may therefore be used to determine the orientation of each of the reflective elements $6a$-$6h$ of the mirror array 6.

Increasing the distance between the mirror array 6 and the plane which is imaged onto the array of detector elements 24 may increase the dependence of the spatial intensity distributions of the image sub-beams $4a'$-$4h'$ on the orientation of the reflective elements $6a$-$6h$. A change in the spatial intensity distribution of an image sub-beam $4a'$-$4h'$ which results from a given change in the orientation of a reflective element $6a$-$6h$ may therefore be larger the further away from the mirror array 6 the plane which is imaged onto the array of detector elements 24 is. The accuracy with which the orientation of the reflective elements $6a$-$6h$ may be determined may therefore be improved by increasing the distance from the mirror array 6 of the plane which is imaged onto the array of detector elements 24.

It may therefore be advantageous to determine the orientation of the reflective elements $6a$-$6h$ at such a time when the reflective elements $6a$-$6h$ are orientated so as to extend the range of non-overlapping planes. For example, in between exposures of one or more substrates W the orientation of the reflective elements $6a$-$6h$ may be changed, (e.g. by actuators) from an orientation which brings about a desired illumination mode at the pupil plane 18, such that the sub-beams $4a$-$4h$ propagate in substantially the same direction (as is shown in FIG. 5). This extends the range of non-overlapping planes and allows a plane which is positioned at a relatively large distance from the mirror array 6 to be imaged onto the array of detector elements. The image which is formed at the array of detector elements 24 may then be used to determine the orientation of the reflective elements $6a$-$6h$. The orientation of the reflective elements $6a$-$6h$ may be determined by imaging a plane which lies upstream of the mirror array 6 or by imaging a plane which lies downstream of the mirror array 6 onto the array of detector elements.

The orientation of the reflective elements $6a$-$6h$ may generally be known since the orientation is controlled by actuators. However after changes in the orientation of the reflective elements $6a$-$6h$ there may an offset between the actual orientation of the reflective elements $6a$-$6h$ and the desired orientation of the reflective elements $6a$-$6h$. For example, the actuators may be controlled so as to orientate the reflective elements $6a$-$6h$ such that they are orientated at the same angle and such that the sub-beams $4a$-$4h$ propagate in the same direction. However in practice one or more of the reflective elements may be offset from their desired orientation. Any offset from a reflective element's desired orientation may be measured by measuring the orientation of the reflective elements $6a$-$6h$ as was described above. This measurement may then be used to calibrate the actuators which control the reflective elements $6a$-$6h$ so as to increase the accuracy with which the orientation of the reflective elements is controlled by the actuators.

Determining the orientation of the reflective elements $6a$-$6h$ by measuring the spatial intensity distribution of the image sub-beams $4a'$-$4h'$ as was described above is advantageous since the determination may be performed faster than alternative methods of determining the orientation of the reflective elements $6a$-$6h$. Alternative methods of determining the orientation of the reflective elements $6a$-$6h$ may include sequentially illuminating each reflective element $6a$-$6h$ with a laser beam and measuring the position to which the laser beam is reflected in order to determine the orientation of each of the reflective elements $6a$-$6h$. However such a method may be relatively time consuming since each reflective element $6a$-$6h$ must be individually illuminated with the laser beam. Such a method may not therefore be performed in between exposures of one or more substrates and may instead require a down-time of the lithographic apparatus LA in order to determine the orientation of the reflective elements $6a$-$6h$. Determining the orientation of the reflective elements $6a$-$6h$ between exposures of one or more substrates may therefore allow any down-time of the lithographic apparatus to be reduced.

In some embodiments two images may be formed from the second portion 14 of the illumination beam 8. This may allow an image of a plane which lies upstream of the mirror array to be formed and an image of a plane which lies downstream of the mirror array to be formed. For example, a second beam splitting device (not shown) may be arranged to receive the second portion 14 of the illumination beam 8 and may split the second portion 14 into a first detection portion and a second detection portion. The first detection portion may be directed to a first focussing unit which is configured to form an image of a plane on a first array of detector elements 24. The plane which the first focussing unit images onto the first array of detector elements 24 may lie between the array of lenses 2 and the mirror array 6. The second detection portion may be directed to a second focussing unit which is configured to form an image of a plane on a second array of detector elements. The plane which the second focussing unit images onto the second array of detector elements may lie downstream of the mirror array 6 at a position at which the sub-beams 4a-4h do not overlap.

In one embodiment the first focussing unit images a first plane which lies at a first distance from the mirror array 6 onto the first array of detector elements. The second focussing unit images a second plane which lies at a second distance from the mirror array 6 onto the second array of detector elements where the second distance is greater than the first distance. Measurements made by the first array of detector elements may be used to independently determine the intensity of each of the sub-beams 4a-4h. The proximity of the first plane to the mirror array 6 may be such that the intensity of each of the sub-beams 4a-4h may be determined during exposure of a substrate W. Measurements made by the second array of detector elements may be used to determine the orientation of the reflective elements 6a-6h. The orientation of the reflective elements 6a-6h may, for example, be determined in between substrate exposures at a time when the range of non-overlapping planes is extended.

In another embodiment the plane which the first focussing unit images onto the first array of detector elements may be the plane of the mirror array. Measurements made by the first array of detector elements may therefore be independent of the orientation of the reflective elements 6a-6h and may be used to independently determine the intensity of each of the sub-beams 4a-4h. The plane which the second focussing unit images onto the second array of detector elements may be a plane which lies either upstream or downstream of the mirror array 6. Measurements made by the second array of detector elements may, for example, be used to determine the orientation of the reflective elements 6a-6h since the image which is formed on the second array of detector elements will depend on the orientation of the reflective elements 6a-6h.

In some embodiments one or more focussing units may be adjustable such that a plane which is imaged on to an array of detector elements may be adjusted. For example, a focussing unit may be operable to switch between imaging a plane which lies upstream of the mirror array 6 onto an array of detector elements and imaging a plane which lies downstream of the mirror array 6 onto the array of detector elements. An adjustable focussing unit may allow a plane which is imaged onto an array of detector elements to be adjusted until image sub-beams 4a'-4h' which are incident on the array of detector elements have a desired size relative to the size of the detector elements. For example, the plane which is imaged onto an array of detector elements may be adjusted until each detector element only receives radiation which corresponds to a single one of the plurality of sub-beams 4a-4h.

Embodiments have been described above in which a plane which lies upstream of the mirror array is imaged onto an array of detector elements and/or a plane which lies downstream of the mirror array is imaged onto an array of detector elements. In some embodiments the plane of the mirror array may be imaged onto an array of detector elements. In embodiments in which the plane of the mirror array is imaged onto the array of detector elements 24, the position of the image sub-beams 4a'-4h' is independent of the orientation of the reflective elements 6a-6h. Since the sub-beams 4a-4h do not overlap in the plane of the mirror array 6, the image sub-beams 4a'-4h' which are formed on the array of detector elements 24 do not overlap. The image which is formed on the array of detector elements 24 may therefore be used to independently determine the intensity of each of the sub-beams 4a-4h. However since the image which is formed on the array of detector elements 24 is independent of the orientation of the reflective elements 6a-6h when the plane of the mirror array 6 is imaged onto the array of detector elements 24, measurements made at the array of detector elements 24 cannot be used to determine the orientation of the reflective elements 6a-6h. In embodiments in which it is desirable to use measurements made at the array of detector elements 24 in order to determine the orientation of the reflective elements 6a-6h it is therefore advantageous to image a plane which lies either upstream or downstream of the mirror array 6 onto the array of detector elements 24.

In the embodiments which are depicted in FIGS. 2 and 5 the focussing unit 22 and the array of detector elements 24 are arranged such that they are substantially parallel with the mirror array 6. As was described above this results in the plane which is imaged onto the array of detector elements 24 also being parallel with the mirror array 6 as shown with the orientation of the first 31, second 32, third 33 and fourth 34 planes in FIGS. 2 and 5. It can be seen from FIGS. 2 and 5 that when a plane which lies upstream of the mirror array 6 (e.g. the first plane 31 or the second plane 32) is imaged onto the array of detector elements 24 the plane which is imaged does not lie perpendicular to the direction of propagation of the radiation beam B (and the sub-beams 4a-4h). Similarly when the plane of the mirror array 6 is imaged onto the array of detector elements 24 the plane which is imaged does not lie perpendicular to the direction of propagation of the sub-beams 4a-4h. For some applications it may be desirable for the plane which is imaged onto the array of detector elements 24 to be perpendicular to the direction of propagation of the sub-beams 4a-4h such that each sub-beam 4a-4h is sampled at the same point along the propagation path of the radiation beam B. For some applications it may therefore be desirable to image a plane which lies downstream of the mirror array 6 onto the array of detector elements 24 since the plane which is imaged onto the array of detector elements 24 lies approximately parallel to the direction of propagation of the sub-beams 4a-4h after they have been reflected from the mirror array 6. For example, it can be seen from FIGS. 2 and 5 that the third 33 and fourth 34 planes which lie downstream of the mirror array 6 are orientated such that they lie approximately parallel to the direction of propagation of the sub-beams 4a-4h after they have been reflected from the mirror array 6.

FIG. 7 is a schematic depiction of a portion of an alternative embodiment of an illumination system IL. In the embodiment which is depicted in FIG. 7 the focussing unit 22 and the array of detector elements 24 are arranged such that they are not parallel to each other and are not parallel to the mirror array 6. The arrangement which is shown in FIG. 7 utilises a principle known as the Scheimpflug principle in order to image a plane onto the array of detector elements 24. The focussing unit 22 and the array of detector elements 24 are arranged such that a tangent 50 to the array of detector elements 24 and a tangent 52 to the focussing unit 22 intersect at a point 54. This arrangement means that a plane or a virtual plane which has a tangent which also intersects the point 54 can be imaged onto the array of detector elements 24. For example, a virtual plane 36' which is shown in FIG. 7 has a tangent 56 which intersects the point 54. The virtual plane 36' has a corresponding plane 36 which lies upstream of the mirror array 6 and lies at the same distance from the mirror array 6 as the virtual plane 36'. Since the virtual plane 36' has a tangent which intersects the point 54 at which the tangent 50 and the tangent 52 intersect, the plane 36 may be imaged onto the array of detector elements. The plane 36 lies perpendicular to the direction of propagation of the sub-beams 4a-4h. The Scheimpflug principle may therefore be used to arrange the focussing unit 22 and the array of detector elements 24 such that a plane which lies upstream of the mirror array 6 and which lies perpendicular to the direction of propagation of the sub-beams 4a-4h can be imaged onto the array of detector elements 24.

Embodiments have been described above which allow the intensities of sub-beams 4a-4h which are reflected from a mirror array 6 to be determined. A determination of the intensities of the sub-beams 4a-4h may be used to determine an orientation of the reflective elements 6a-6h which will bring about a desired illumination mode at the pupil plane 18. For example, the measured intensities of the sub-beams 4a-4h may be input to a controller which may determine a desired orientation of the reflective elements 6a-6h which redistributes the sub-beams 4a-4h so as to form a desired spatial intensity distribution at the pupil plane 18. The controller may control actuators which are operable to change the orientation of each of the reflective elements 6a-6h so as to bring about the desired orientation of the reflective elements 6a-6h. The array of detector elements 24, the controller and the actuators therefore form a feedback system which acts to bring about and maintain a desired illumination mode at the pupil plane 18.

As was described above the intensities of the sub-beams 4a-4h may be determined during an exposure of a substrate by imaging a plane which lies in a range of non-overlapping planes. During an exposure of a substrate the orientation of the reflective elements 6a-6h may be such that the range of non-overlapping planes is a relatively small range centred on the mirror array 6. Determining the intensities of the sub-beams 4a-4h during an exposure of a substrate may allow the intensities to be determined continuously and the measured intensities of the sub-beams 4a-4h may be monitored for any changes in the intensities. If a change in the intensities is detected then the controller may determine an orientation of the reflective elements 6a-6h which compensates for the detected change in the intensities. The controller may then control actuators so as to change the orientation of one or more reflective elements 6a-6h in order to compensate for the change in the intensities of the sub-beams 4a-4h such that a desired illumination mode is formed at the pupil plane 18. For example, if the sub-beam reflected by a given reflective element is too intense for a particular location in the pupil plane then that reflective element may be reoriented to direct that sub-beam towards a different location in the pupil plane. Optionally, a sub-beam with a lower intensity may instead be directed towards that location by reorienting a different reflective element.

Alternatively the intensities of the sub-beams 4a-4h may be determined on a periodic basis and the orientation of the reflective elements may be periodically updated in response to the determined intensities of the sub-beams 4a-4h.

Additionally or alternatively the intensities of the sub-beams 4a-4h may be determined at times in between exposures of one or more substrates W. In between exposures the reflective elements 6a-6h may be orientated so as to extend the range of non-overlapping planes. For example, the reflective elements 6a-6h may be orientated such that each sub-beam 4a-4h is reflected so as to propagate in substantially the same direction. Extending the range of non-overlapping planes allows greater flexibility as to the plane which is imaged onto the array of detector elements 24 and may, for example, allow a plane to be imaged onto the array of detector elements which brings about a desired relationship between the size and position of image sub-beams 4a'-4h' and detector elements 25 of the array of detector elements 24. For example, a plane may be imaged onto the array of detector elements 24 such that each detector element 2 only receives radiation corresponding to a single image sub-beam 4a'-4h'.

Additionally or alternatively, extending the range of non-overlapping planes may allow a plane to be imaged onto the array of detector elements 24 which lies sufficiently far from the mirror array 6 that the image may be used to determine the orientation of the reflective elements 6a-6h. A determination of the orientation of the reflective elements 6a-6h may, for example, be used to calibrate actuators which control the orientation of the reflective elements 6a-6h. An actuator may, for example, be calibrated by varying a voltage which is applied to the actuator. Varying the voltage which is applied to the actuator will cause a variation in the orientation of a reflective element whose orientation is controlled by the actuator. A change in the orientation of the reflective element may be determined by imaging a plane which lies sufficiently far from the mirror array 6 onto an array of detector elements 24 as was described above. Determining the change in the orientation of the reflective element which results from a given variation of the voltage which is applied to the actuator allows the sensitivity of the orientation of the reflective element to the applied voltage to be determined. The determined sensitivity may then be used to determine a change in applied voltage which is needed in order to bring about a desired change in the orientation of the reflective element. Whilst embodiments have been described above in which the range of non-overlapping planes is extended by orientating the reflective elements 6a-6h such that they are each orientated at substantially the same angle and such that each sub-beam 4a-4h is reflected to propagate in substantially the same direction, other orientations of the reflective elements 6a-6h may instead be used to extend the range of non-overlapping planes. For example, if a plane which lies downstream of the mirror array 6 is imaged onto the array of detector elements 24 then the reflective elements 6a-6h may be orientated so as to form a generally convex shaped mirror. If a plane which lies upstream of the mirror array 6 is imaged onto the array of detector elements 24 then the reflective elements 6a-6h may be orientated so as to form a generally concave shaped mirror. References to the reflective elements 6a-6h forming a generally convex or concave shape should be interpreted to mean that the centres of the reflective elements 6a-6h are substantially parallel to a convex or concave shape.

In general any orientation of the reflective elements 6a-6h may be used which extends the range of planes in which the sub-beams 4a-4h do not overlap with each other.

In some embodiments the intensities of the sub-beams 4a-4h may be determined after a change in the operational mode of the lithographic apparatus.

For example, if an operating parameter of the radiation source SO is changed then the intensities of the sub-beams 4a-4h may be determined in order to determine the effect of the change in operating parameter of the radiation source SO. The orientation of one or more reflective elements 6a-6h may then be adjusted in order to compensate for any changes in the intensities of the sub-beams 4a-4h which is caused by the change in the operating parameter.

Embodiments have been described above in which an image is formed of the sub-beams 4a-4h from a second portion 14 of the illumination beam 8. In some embodiments the image which is formed is an image of a plane which lies upstream of the mirror array 6. However it will be appreciated that even if a plane which lies upstream of the mirror array 6 is imaged onto the array of detector elements 24, the radiation which forms the image is still reflected by the mirror array 6 before arriving at the array of detector elements and thus the reflectivity of the reflective elements 6a-6h affects the intensities of the image sub-beams 4a'-4h' which are formed in the image. Furthermore the intensities of the image sub-beams 4a'-4h' are affected by any attenuation of the sub-beams which occurs upstream of the beam splitting device 10. For example a change in the transmission of a lens 2a-2h of the array of lenses 2 will cause a change in the intensity of an image sub-beam 4a-4h which is incident on the array of detectors 24. A feedback system which orientates the reflective elements 6a-6h according to a measurement made at the array of detector elements 24 will therefore advantageously account for any changes in the reflectivities of the reflective elements 6a-6h and any attenuation of the sub-beams which occurs upstream of the beam splitting device 10. Positioning the beam splitting device 10 and the array of detector elements 24 downstream of the mirror array 6 is therefore advantageous since changes in the reflectivities of the reflective elements 6a-6h may be accounted for.

In addition to using measurements of an image formed on an array of detector elements to determine the intensities of the sub-beams 4a-4h and/or the orientation of the reflective elements 6a-6h, the measurements may also be used to determine the alignment of the filter element 3. In an embodiment in which the filter element 3 comprises apertures 5a-5h then if the filter element 3 is incorrectly aligned then the sub-beams 4a-4h may not be aligned with the apertures 5a-5h in the filter element 3. Portions of the sub-beams 4a-4h may therefore be blocked by the filter element 3 thereby reducing the cross-sections of the sub-beams which are incident on the mirror array 6. A reduction in the cross-sections of sub-beams 4a-4h which are incident on the mirror array 6 will also cause a reduction in the cross-sections of the image sub-beams 4a'-4h' which are incident on the array of detector elements 24. A reduction in the cross-sections of the image sub-beams 4a'-4h' may be detected at the array of detector elements 24 and may be used to determine the alignment of the filter element 3 relative to the sub-beams 4a-4h.

Measurements made by the array of detector elements 24 may additionally or alternatively be used to diagnose faulty reflective elements 6a-6h. For example, if a reflective element 6a-6h (or an actuator which controls a reflective element 6a-6h) develops a fault then the reflective element may become stuck in a particular orientation. A sub-beam 4a-4h which is reflected from a reflective element 6a-6h which is stuck in a particular orientation will continue to be directed in a particular direction even if a change of orientation of the reflective elements is desired (e.g. in order to change the illumination mode). The sub-beam 4a-4h may have a respective image sub-beam 4a'-4h' which is incident on the array of detector elements 24. If a reflective element 6a-6h has developed a fault then the position of the corresponding image sub-beam 4a'-4h' on the array of detector elements 24 may remain the same even if a change of orientation of the reflective element is desired (e.g. in order to change the illumination mode). This may be detected by the array of detector elements 24 which may diagnose a fault with a reflective element 6a-6h. In the event that a faulty reflective element 6a-6h is diagnosed an aperture in the filter element 3 may be blocked in order to prevent a sub-beam 4a-4h being incident on the faulty reflective element 6a-6h. Alternatively in an embodiment in which the filter element 3 comprises a transparent material, a region of the transparent material may be coated (e.g. with chromium) in order to prevent a sub-beam 4a-4h from being transmitted by the filter element 3 and from being incident on the faulty reflective element 6a-6h.

As was described above, in an embodiment in which the plane of the mirror array 6 is imaged onto the array of detector elements 24, the position of the image sub-beams 4a-4h on the array of detector elements 24 is independent of the orientation of the reflective elements 6a-6h. In such an embodiment it may not be possible to diagnose a faulty reflective element 6a-6h because all of the image sub-beams 4a'-4h' will remain in the same position on the array of detector elements 24 irrespective of whether or not the reflective elements 6a-6h are faulty. In an embodiment in which it is desirable to be able to diagnose a faulty reflective element 6a-6h it is therefore advantageous to image a plane which lies either upstream or downstream of the mirror array 6 onto the array of detector elements 24 as opposed to imaging the plane of the mirror array 6 onto the array of detector elements 24.

Whilst embodiments of an illumination system IL have been described above in which an array of lenses 2 focuses sub-beams 4a-4h onto the reflective elements 6a-6h of the mirror array 6, in some embodiments the illumination system IL may not include an array of lenses. In such embodiments the radiation beam B may illuminate the mirror array 6 without being split into sub-beams 4a-4h. In embodiments which include a filter element 3, the apertures in the filter element may act to split the radiation beam B into sub-beams 4a-4h prior to the mirror array 6. However the filter element 3 is an optional feature which may not be present in some embodiments.

In embodiments in which the radiation beam B is not split into sub-beams 4a-4b prior to being incident on the mirror array 6, the reflective elements 6a-6h of the mirror array will serve to split the radiation beam B into sub-beams 4a-4h since the reflective elements have different orientations. Image sub-beams 4a'-4h' will still therefore be formed on the array of detector elements if a plane which is downstream of the mirror array is imaged on to the array of detector elements 24. In embodiments in which a plane which lies downstream of the mirror array 6 is imaged onto the array of detector elements 24 the intensity of each sub-beam 4a-4h may therefore still be independently determined even in the absence of an array of lenses 2. The array of lenses 2 is therefore an optional feature of embodiments in which a plane which lies downstream of the mirror array 6 is imaged onto the array of detector elements 24.

In embodiments in which a plane which lies upstream of the mirror array 6 is imaged onto the array of detector elements 24 and the radiation beam B is not split into sub-beams 4a-4h prior to the mirror array 6 (e.g. because there is no array of lenses 2) then separate image sub-beams 4a'-4h' may not be formed on the array of detectors 24. Instead an image of the un-split radiation beam B may be formed on the array of detector elements 24. Whilst an image of the un-split radiation beam B may be used to monitor changes in the spatial intensity distribution of the radiation beam B, it may not allow the intensities of each of the sub-beams 4a-4h to be independently determined. An array of lenses 2 which focusses the radiation beam B into sub-beams 4a-4h prior to the mirror array 6 is therefore advantageous in embodiments in which a plane which lies upstream of the mirror array is imaged onto the array of detector elements 24 since this allows the intensity of each sub-beam 4a-4h to be independently determined.

Embodiments have been described above in which a second portion 14 of the illumination beam 8 is focussed by a focussing unit 22 to be directly incident onto an array of detector elements 24. However, in some embodiments the second portion 14 of the illumination beam 8 may not be focussed directly onto the array of detector elements 24. For example the second portion 14 of the illumination beam 8 may instead be focussed onto a fluorescent plate. The fluorescent plate absorbs radiation from the second portion 14 of the illumination beam 8 which subsequently causes the fluorescent plate to emit radiation. Radiation which is emitted from the fluorescent plate may be received by an array of detector elements. The array of detector elements may measure the intensity of radiation which is emitted from the fluorescent plate and may use this to determine the intensity of the radiation which is incident on the fluorescent plate.

In general the second portion 14 of the illumination beam 8 is focussed onto a detection plane so as to form an image at the detection plane. An array of detector elements 24 is configured to measure the intensity of radiation which is incident on the detection plane. The array of detector elements 24 may be positioned substantially at the detection plane. Alternatively the array of detector elements 24 may be separated from the detection plane. For example a fluorescent plate may be positioned substantially at the detection plane and the array of detector elements 24 may be arranged to measure radiation which is emitted from the fluorescent plate.

In an embodiment, there is provided an illumination system for a lithographic apparatus comprising: an array of lenses configured to receive a beam of radiation and focus the beam of radiation into a plurality of sub-beams; an array of reflective elements configured to receive the sub-beams and reflect the sub-beams so as to form an illumination beam; a beam splitting device configured to split the illumination beam into a first portion and a second portion wherein the first portion is directed to be incident on a lithographic patterning device; a focusing unit configured to focus the second portion of the illumination beam onto a detection plane such that an image is formed at the detection plane and wherein the image is an image of the plurality of sub-beams in a plane which lies upstream of the array of reflective elements and wherein the sub-beams do not overlap with each other in the image; and an array of detector elements configured to measure the intensity of radiation which is incident on the detection plane.

In an embodiment, there is provided an illumination system for a lithographic apparatus comprising: an array of reflective elements configured to receive a beam of radiation and reflect a plurality of sub-beams of the radiation beam so as to form an illumination beam; a beam splitting device configured to split the illumination beam into a first portion and a second portion wherein the first portion is directed to be incident on a lithographic patterning device; a focusing unit configured to focus the second portion of the illumination beam onto a detection plane such that an image is formed at the detection plane and wherein the image is an image of the plurality of sub-beams in a plane which lies downstream of the array of reflective elements and wherein the sub-beams do not overlap with each other in the image; and an array of detector elements configured to measure the intensity of radiation which is incident on the detection plane.

In an embodiment, the illumination system further comprises an array of lenses configured to receive the beam of radiation, focus the beam of radiation into the plurality of sub-beams and direct the plurality of sub-beams onto the array of reflective elements. In an embodiment, the array of detector elements is arranged such that a plurality of detector elements receives radiation which corresponds to each sub-beam. In an embodiment, the illumination system further comprises a controller configured to determine a spatial intensity distribution of each sub-beam and use the spatial intensity distribution to determine the orientation of each of the reflective elements of the array of reflective elements. In an embodiment, the focusing unit is configured to focus the second portion of the illumination beam onto the detection plane such that each detector element receives radiation which corresponds to a single one of the plurality of sub-beams. In an embodiment, the illumination system further comprises a controller configured to determine the intensity of each of the plurality of sub-beams. In an embodiment, the illumination system further comprises a plurality of actuators configured to adjust the orientation of the reflective elements of the array of reflective elements. In an embodiment, the controller is operable, during an illumination time period, to control the actuators in response to the determined intensities of the plurality of sub-beams so as to form an illumination beam having a desired spatial intensity distribution. In an embodiment, the controller is further operable to control the actuators, at times other than during the illumination time period, so as to orientate the reflective elements such that a range of planes, which when imaged onto the detection plane form an image of the sub-beams in which the sub-beams do not overlap, is extended when compared to the range of planes during the illumination time period. In an embodiment, the focusing unit is operable to adjust the plane which is imaged onto the detection plane. In an embodiment, the illumination system further comprises a filter element positioned upstream of the array of reflective elements, wherein the filter element is configured to transmit radiation such that it is incident on the array of reflective elements. In an embodiment, the filter element is operable to block one or more regions of the filter element so as to prevent radiation from being incident on one or more reflective elements. In an embodiment, the array of detector elements are positioned substantially at the detection plane. In an embodiment, the illumination system further comprises comprising a fluorescent plate positioned substantially at the detection plane and wherein the array of detector elements are configured to measure the intensity of radiation which is emitted from the fluorescent plate. In an embodiment, the illumination system further comprises a second beam splitting device configured to split the second portion of the illumination beam into a first detection beam and a second detection beam, wherein the first detection beam is directed to the detection system and the second detection beam is directed to a second detection system comprising a second focusing unit and a second array of detector elements, wherein the second focusing unit is configured to focus the second detection beam onto a second detection plane such that a second image is formed at the second detection plane and wherein the second image is an image of the plurality of sub-beams in a second plane which is different to the plane which is imaged by the detection system which receives the first detection beam. In an embodiment, the focusing unit is orientated substantially parallel with the detection plane. In an embodiment, the focusing unit is orientated substantially parallel with the array of reflective elements. In an embodiment, the illumination system further comprises a controller configured to determine, from measurements made by the array of detector elements, a fault with a reflective element of the array of reflective elements. In an embodiment, a lithographic apparatus comprises: an illumination system as described herein; a support structure for supporting a patterning device, the patterning device serving to impart the first portion of the illumination beam with a pattern in its cross-section, thereby forming a patterned radiation beam; a substrate table for holding a substrate; and a projection system for projecting the patterned radiation beam onto a target portion of the substrate.

In an embodiment, there is provided a method of imaging a radiation beam, the method comprising: providing a beam of radiation; focusing the radiation beam with an array of lenses into a plurality of sub-beams; reflecting the plurality of sub-beams with an array of reflective elements so as to form an illumination beam; splitting the illumination beam into a first portion and a second portion; directing the first portion of the illumination beam to be incident on a lithographic patterning device; focusing the second portion of the illumination beam such that an image is formed at a detection plane, wherein the image is an image of the plurality of sub-beams in a plane which lies upstream of the array of reflective elements and wherein the sub-beams do not overlap with each other in the image; and measuring the intensity of radiation which is incident on the detection plane with an array of detector elements.

In an embodiment, there is provided a method of imaging a radiation beam, the method comprising: providing a beam of radiation; reflecting a plurality of sub-beams of the beam of radiation with an array of reflective elements so as to form an illumination beam; splitting the illumination beam into a first portion and a second portion; directing the first portion of the illumination beam to be incident on a lithographic patterning device; focusing the second portion of the illumination beam such that an image is formed at a detection plane, wherein the image is an image of the plurality of sub-beams in a plane which lies downstream of the array of reflective elements and wherein the sub-beams do not overlap with each other in the image; and measuring the intensity of radiation which is incident on the detection plane with an array of detector elements.

In an embodiment, the method further comprises focusing the radiation beam with an array of lenses into the plurality of sub-beams and directing the plurality of sub-beams onto the array of reflective elements. In an embodiment, the array of detector elements is arranged such that a plurality of detector elements receives radiation which corresponds to each sub-beam. In an embodiment, the method further comprises determining a spatial intensity distribution of each sub-beam and using the spatial intensity distribution to determine the orientation of each of the reflective elements of the array of reflective elements. In an embodiment, the second portion of the illumination beam is focused onto the detection plane such that each detector element receives radiation which corresponds to a single one of the plurality of sub-beams. In an embodiment, the method further comprises determining the intensity of each of the plurality of sub-beams. In an embodiment, the method further comprises adjusting the orientation of the reflective elements of the array of reflective elements, during an illumination time period, in response to the determined intensities of the plurality of sub-beams so as to form an illumination beam having a desired spatial intensity distribution. In an embodiment, the method further comprises g adjusting the orientation of the reflective elements of the array of reflective elements, at times other than during the illumination time period, such that a range of planes, which when imaged onto the detection plane form an image of the sub-beams in which the sub-beams do not overlap, is extended when compared to the range of planes during the illumination time period. In an embodiment, the method further comprises determining the intensity of each of the plurality of sub-beams at times other than during the illumination time period. In an embodiment, the method further comprises determining the orientation of the reflective elements at times other than during the illumination time period. In an embodiment, the method further comprises adjusting the plane which is imaged onto the detection plane. In an embodiment, the method further comprises aligning a filter element positioned upstream of the array of reflective elements according to measurements made by the array of detector elements, wherein the filter element is configured to transmit radiation to be incident on the array of reflective elements. In an embodiment, the method further comprises blocking one or more regions of the filter element so as to prevent radiation from being incident on one or more reflective elements. In an embodiment, the method further comprises determining, from the measurements of the intensity of radiation which is incident on the detection plane, a fault with a reflective element of the array of reflective elements. In an embodiment, the method further comprises splitting the second portion of the illumination beam into a first detection beam and a second detection beam, wherein the first detection beam is directed to the detection system; and focusing the second detection beam such that a second image is formed at a second detection plane and wherein the second image is an image of the plurality of sub-beams in a second plane which is different to the plane which is imaged by the detection system which receives the first detection beam.

In an embodiment, there is provided an illumination system for a lithographic apparatus comprising: an array of lenses configured to receive a beam of radiation and focus the beam of radiation into a plurality of sub-beams; an array of reflective elements configured to receive the sub-beams and reflect the sub-beams so as to form an illumination beam; a beam splitting device configured to split the illumination beam into a first portion and a second portion wherein the first portion is directed to be incident on a lithographic patterning device; a focusing unit configured to focus the second portion of the illumination beam onto a detection plane such that an image is formed at the detection plane and wherein the image is an image of the plurality of sub-beams in which the sub-beams do not overlap with each other; and an array of detector elements configured to measure the intensity of radiation which is incident on the detection plane.

In an embodiment, there is provided a method of imaging a radiation beam, the method comprising: providing a beam of radiation; focusing the radiation beam with an array of lenses into a plurality of sub-beams; reflecting the plurality of sub-beams with an array of reflective elements so as to form an illumination beam; splitting the illumination beam into a first portion and a second portion; directing the first portion of the illumination beam to be incident on a lithographic patterning device; focusing the second portion of the illumination beam such that an image is formed at a detection plane, wherein the image is an image of the plurality of sub-beams in which the sub-beams of the plurality of sub-beams do not overlap with each other; and measuring the intensity of radiation which is incident on the detection plane with an array of detector elements.

While specific embodiments of the invention have been described above, it will be appreciated that the invention may be practiced otherwise than as described. The description is not intended to limit the invention.

The invention claimed is:

1. An illumination system for a lithographic apparatus, the illumination system comprising:
   an array of reflective elements configured to receive an incident beam of radiation and reflect a plurality of sub-beams of the radiation so as to form an illumination beam;
   a beam splitting device configured to split the illumination beam into a first portion and a second portion wherein the first portion is directed to be incident on a lithographic patterning device;
   a focusing unit configured to focus the second portion of the illumination beam onto a detection plane such that an image is formed at the detection plane and wherein the image is an image of the plurality of sub-beams or of a plurality of sub-beams in the incident beam of radiation, in which the sub-beams do not overlap with each other in the image; and
   an array of detector elements configured to measure the intensity of radiation which is incident on the detection plane.

2. The illumination system of claim 1, further comprising an array of lenses configured to receive the radiation, focus the radiation into the plurality of sub-beams of the incident radiation beam and direct the plurality of sub-beams of the incident radiation beam onto the array of reflective elements.

3. The illumination system of claim 1, wherein the array of detector elements is arranged such that a plurality of detector elements receives radiation which corresponds to each sub-beam.

4. The illumination system of claim 3, further comprising a controller configured to determine a spatial intensity distribution of each sub-beam and use the spatial intensity distribution to determine the orientation of each of the reflective elements of the array of reflective elements.

5. The illumination system of claim 1, wherein the focusing unit is configured to focus the second portion of the illumination beam onto the detection plane such that each detector element receives radiation which corresponds to a single one of the plurality of sub-beams.

6. The illumination system of claim 1, further comprising a controller configured to determine the intensity of each of the plurality of sub-beams.

7. The illumination system of claim 6, wherein the controller is operable, during an illumination time period, to control the orientation of the reflective elements in response to the determined intensities of the plurality of sub-beams so as to form an illumination beam having a desired spatial intensity distribution.

8. The illumination system of claim 7, wherein the controller is further operable to control the orientation of the reflective elements, at times other than during the illumination time period, so as to orientate the reflective elements such that a range of planes, which when imaged onto the detection plane form an image of the sub-beams in which the sub-beams do not overlap, is extended when compared to the range of planes during the illumination time period.

9. The illumination system of any preceding claim 1, wherein the focusing unit is operable to adjust the plane which is imaged onto the detection plane.

10. The illumination system of claim 1, further comprising a controller configured to determine, from measurements made by the array of detector elements, a fault with a reflective element of the array of reflective elements.

11. A lithographic apparatus comprising:
    the illumination system as claimed by claim 1;
    a support structure configured to support a patterning device, the patterning device serving to impart the first portion of the illumination beam with a pattern in its cross-section, thereby forming a patterned radiation beam;
    a substrate table configured to hold a substrate; and
    a projection system configured to project the patterned radiation beam onto a target portion of the substrate.

12. A method of imaging a radiation beam, the method comprising:
    providing an incident beam of radiation to an array of reflective elements;
    reflecting a plurality of sub-beams of the radiation with the array of reflective elements so as to form an illumination beam;
    splitting the illumination beam into a first portion and a second portion;
    directing the first portion of the illumination beam to be incident on a lithographic patterning device;
    focusing the second portion of the illumination beam such that an image is formed at a detection plane, wherein the image is an image of the plurality of sub-beams or of a plurality of sub-beams in the incident beam of radiation, in which the sub-beams do not overlap with each other in the image; and
    measuring the intensity of radiation which is incident on the detection plane with an array of detector elements.

13. The method of claim 12, further comprising focusing the radiation with an array of lenses into the plurality of sub-beams of the incident radiation beam and directing the plurality of sub-beams of the incident radiation beam onto the array of reflective elements.

14. The method of claim 12, wherein the array of detector elements is arranged such that a plurality of detector elements receives radiation which corresponds to each sub-beam.

15. The illumination system of claim 1, wherein the incident beam of radiation comprises a plurality of sub-beams and the image is of the plurality of sub-beams of the incident beam of radiation.

16. The illumination system of claim 1, wherein the image is an image of the plurality of sub-beams in a plane which lies upstream of the array of reflective elements.

17. The illumination system of claim 1, wherein the image is an image of the plurality of sub-beams in a plane which lies downstream of the array of reflective elements.

18. The method of claim 12, wherein the incident beam of radiation comprises a plurality of sub-beams and the image is of the plurality of sub-beams of the incident beam of radiation.

19. The method of claim 12, wherein the image is an image of the plurality of sub-beams in a plane which lies upstream of the array of reflective elements.

20. The method of claim 12, wherein the image is an image of the plurality of sub-beams in a plane which lies downstream of the array of reflective elements.

* * * * *